(12) United States Patent
Kobayashi

(10) Patent No.: US 7,994,704 B2
(45) Date of Patent: Aug. 9, 2011

(54) LIGHT-EMITTING DEVICE, IMAGE FORMING APPARATUS, DISPLAY DEVICE, AND ELECTRONIC APPARATUS

(75) Inventor: Hidekazu Kobayashi, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 123 days.

(21) Appl. No.: 12/578,215

(22) Filed: Oct. 13, 2009

(65) Prior Publication Data

US 2010/0026180 A1 Feb. 4, 2010

Related U.S. Application Data

(62) Division of application No. 11/753,206, filed on May 24, 2007, now Pat. No. 7,622,865.

(30) Foreign Application Priority Data

Jun. 19, 2006 (JP) ................................. 2006-168402
Jun. 19, 2006 (JP) ................................. 2006-168403

(51) Int. Cl.
  *H01J 1/62* (2006.01)
(52) U.S. Cl. .......................... 313/503; 313/505; 313/506
(58) Field of Classification Search .......... 313/498–512; 315/169.3, 169.4; 428/690; 257/40, 79
See application file for complete search history.

(56) References Cited

U.S. PATENT DOCUMENTS

| | | | |
|---|---|---|---|
| 5,780,174 A | 7/1998 | Tokito et al. | |
| 5,847,506 A | 12/1998 | Nakayama et al. | |
| 6,639,250 B1 | 10/2003 | Shimoda et al. | |
| 6,831,409 B2 | 12/2004 | Yamada | |
| 6,849,869 B1 | 2/2005 | O'Regan et al. | |
| 6,861,800 B2 | 3/2005 | Tyan et al. | |
| 6,905,788 B2 | 6/2005 | Tyan et al. | |
| 7,321,197 B2 | 1/2008 | Nakayama et al. | |
| 7,838,327 B2 * | 11/2010 | Lee et al. ........................ | 438/99 |
| 2004/0140757 A1 | 7/2004 | Tyan et al. | |
| 2004/0140758 A1 | 7/2004 | Raychaudhuri et al. | |
| 2004/0155576 A1 | 8/2004 | Tyan et al. | |
| 2005/0225232 A1 * | 10/2005 | Boroson et al. ............... | 313/504 |
| 2005/0236982 A1 | 10/2005 | Nakayama et al. | |
| 2006/0097631 A1 | 5/2006 | Lee | |
| 2006/0244368 A1 | 11/2006 | Nagayama et al. | |
| 2009/0153036 A1 * | 6/2009 | Gonda .......................... | 313/504 |
| 2009/0261716 A1 * | 10/2009 | Choi et al. .................... | 313/504 |

(Continued)

FOREIGN PATENT DOCUMENTS

JP  A-9-101761  4/1997

(Continued)

*Primary Examiner* — Peter Macchiarolo
(74) *Attorney, Agent, or Firm* — Oliff & Berridge, PLC

(57) ABSTRACT

A light-emitting device includes: a substrate; a light reflection layer that is formed on the substrate and reflects light; a first electrode that is formed on the light reflection layer and transmits light; a light-emitting layer that is formed on the first electrode and emits light; a second electrode that is formed on the light-emitting layer and transmits a part of light from the light-emitting layer and reflects the rest of the light from the light-emitting layer; and a conductive transflective layer that is formed on the second electrode and that transmits a part of light from the second electrode and reflects the rest of the light from the second electrode. A work function of the second electrode is 4 eV (electron volts) or less. The conductive transflective layer is formed of a metal material having a higher optical reflectance than the second electrode.

6 Claims, 29 Drawing Sheets

U.S. PATENT DOCUMENTS

2010/0026178 A1 * 2/2010 Hwang et al. ............... 313/506

FOREIGN PATENT DOCUMENTS

| | | |
|---|---|---|
| JP | B2 3274527 | 4/2002 |
| JP | A-2002-151249 | 5/2002 |
| JP | A-2002-367770 | 12/2002 |
| JP | A-2003-505823 | 2/2003 |
| JP | A-2003-178871 | 6/2003 |
| JP | A 2004-228082 | 8/2004 |
| JP | A 2004-253390 | 9/2004 |
| JP | A-2005-44778 | 2/2005 |
| JP | A 2005-071919 | 3/2005 |
| JP | A 2005-285386 | 10/2005 |
| JP | A 2006-080023 | 3/2006 |
| JP | A 2006-140151 | 6/2006 |
| JP | A-2006-156427 | 6/2006 |
| WO | WO 2005/004550 A1 | 1/2005 |

* cited by examiner

| EMITTED LIGHT | | | | |
|---|---|---|---|---|
| TOTAL LUMINOUS FLUX OUTPUT EFFICIENCY | CIE1931x | CIE1931y | PEAK WAVELENGTH [nm] | HALF-VALUE WIDTH [nm] |
| 0.301 | 0.685 | 0.315 | 643.9 | 52.5 |

| FRONT-EMITTED LIGHT | | | | | |
|---|---|---|---|---|---|
| FRONT-DIRECTION POWER OUTPUT EFFICIENCY | CIE1931x | CIE1931y | PEAK WAVELENGTH [nm] | HALF-VALUE WIDTH [nm] | TRUE BORDER COLOR DIFFERENCE |
| 0.02746 | 0.682 | 0.318 | 639.2 | 51.5 | 0.004 |

Ca5nm/Ag8nm

| EMITTED LIGHT | | | | |
|---|---|---|---|---|
| TOTAL LUMINOUS FLUX OUTPUT EFFICIENCY | CIE1931x | CIE1931y | PEAK WAVELENGTH [nm] | HALF-VALUE WIDTH [nm] |
| 0.212 | 0.674 | 0.325 | 632.6 | 53.3 |

| FRONT-EMITTED LIGHT | | | | | |
|---|---|---|---|---|---|
| FRONT-DIRECTION POWER OUTPUT EFFICIENCY | CIE1931x | CIE1931y | PEAK WAVELENGTH [nm] | HALF-VALUE WIDTH [nm] | TRUE BORDER COLOR DIFFERENCE |
| 0.0266 | 0.670 | 0.330 | 628.5 | 52.0 | 0.006 |

Ca5nm/Ag_xnm

| p [nm] | EMITTED LIGHT | | | | FRONT-EMITTED LIGHT |
|---|---|---|---|---|---|
| | CIE1931x | CIE1931y | PEAK WAVELENGTH [nm] | HALF-VALUE WIDTH [nm] | FRONT-DIRECTION POWER OUTPUT EFFICIENCY |
| 5 | 0.669 | 0.330 | 632.4 | 62.3 | 0.02116 |
| 6 | 0.671 | 0.329 | 632.6 | 59.2 | 0.02143 |
| 7 | 0.673 | 0.327 | 632.7 | 56.2 | 0.02159 |
| 8 | 0.674 | 0.325 | 632.6 | 53.3 | 0.02166 |
| 9 | 0.676 | 0.324 | 632.5 | 50.5 | 0.02163 |
| 10 | 0.677 | 0.323 | 632.2 | 47.8 | 0.02151 |
| 11 | 0.678 | 0.322 | 632.0 | 45.2 | 0.02130 |
| 12 | 0.679 | 0.320 | 631.7 | 42.9 | 0.02102 |
| 13 | 0.680 | 0.320 | 631.4 | 40.8 | 0.02066 |
| 14 | 0.681 | 0.319 | 631.1 | 38.7 | 0.02024 |
| 15 | 0.682 | 0.317 | 630.7 | 36.8 | 0.01976 |
| 16 | 0.683 | 0.317 | 630.4 | 35.1 | 0.01924 |
| 17 | 0.683 | 0.317 | 630.1 | 33.6 | 0.01867 |
| 18 | 0.684 | 0.316 | 629.9 | 32.1 | 0.01806 |
| 19 | 0.684 | 0.316 | 629.6 | 30.6 | 0.01743 |
| 20 | 0.685 | 0.315 | 629.3 | 29.4 | 0.01677 |

| EMITTED LIGHT | | | | |
|---|---|---|---|---|
| TOTAL LUMINOUS FLUX OUTPUT EFFICIENCY | CIE1931x | CIE1931y | PEAK WAVELENGTH [nm] | HALF-VALUE WIDTH [nm] |
| 0.202 | 0.670 | 0.329 | 632.9 | 60.6 |

| FRONT-EMITTED LIGHT | | | | | |
|---|---|---|---|---|---|
| FRONT-DIRECTION POWER OUTPUT EFFICIENCY | CIE1931x | CIE1931y | PEAK WAVELENGTH [nm] | HALF-VALUE WIDTH [nm] | TRUE BORDER COLOR DIFFERENCE |
| 0.01923 | 0.667 | 0.333 | 629.1 | 59.0 | 0.005 |

| EMITTED LIGHT ||||| 
|---|---|---|---|---|
| TOTAL LUMINOUS FLUX OUTPUT EFFICIENCY | CIE1931x | CIE1931y | PEAK WAVELENGTH [nm] | HALF-VALUE WIDTH [nm] |
| 0.136 | 0.669 | 0.331 | 624.7 | 44.5 |

| FRONT-EMITTED LIGHT ||||||
|---|---|---|---|---|---|
| FRONT-DIRECTION POWER OUTPUT EFFICIENCY | CIE1931x | CIE1931y | PEAK WAVELENGTH [nm] | HALF-VALUE WIDTH [nm] | TRUE BORDER COLOR DIFFERENCE |
| 0.01448 | 0.663 | 0.337 | 620.7 | 44.1 | 0.008 |

| EMITTED LIGHT | | | | |
|---|---|---|---|---|
| TOTAL LUMINOUS FLUX OUTPUT EFFICIENCY | CIE1931x | CIE1931y | PEAK WAVELENGTH [nm] | HALF-VALUE WIDTH [nm] |
| 0.137 | 0.673 | 0.327 | 623.9 | 41.0 |

| FRONT-EMITTED LIGHT | | | | | |
|---|---|---|---|---|---|
| FRONT-DIRECTION POWER OUTPUT EFFICIENCY | CIE1931x | CIE1931y | PEAK WAVELENGTH [nm] | HALF-VALUE WIDTH [nm] | TRUE BORDER COLOR DIFFERENCE |
| 0.01589 | 0.666 | 0.333 | 619.6 | 40.8 | 0.010 |

| EMITTED LIGHT (G LIGHT) | | | | |
|---|---|---|---|---|
| TOTAL LUMINOUS FLUX OUTPUT EFFICIENCY | CIE1931x | CIE1931y | PEAK WAVELENGTH [nm] | HALF-VALUE WIDTH [nm] |
| 0.231 | 0.323 | 0.656 | 542.3 | 44.6 |

| FRONT-EMITTED LIGHT (G LIGHT) | | | | | |
|---|---|---|---|---|---|
| FRONT-DIRECTION POWER OUTPUT EFFICIENCY | CIE1931x | CIE1931y | PEAK WAVELENGTH [nm] | HALF-VALUE WIDTH [nm] | TRUE BORDER COLOR DIFFERENCE |
| 0.02540 | 0.307 | 0.668 | 538.4 | 42.8 | 0.021 |

| EMITTED LIGHT (B LIGHT) | | | | |
|---|---|---|---|---|
| TOTAL LUMINOUS FLUX OUTPUT EFFICIENCY | CIE1931x | CIE1931y | PEAK WAVELENGTH [nm] | HALF-VALUE WIDTH [nm] |
| 0.095 | 0.135 | 0.058 | 463.2 | 25.3 |

| FRONT-EMITTED LIGHT (B LIGHT) | | | | | |
|---|---|---|---|---|---|
| FRONT-DIRECTION POWER OUTPUT EFFICIENCY | CIE1931x | CIE1931y | PEAK WAVELENGTH [nm] | HALF-VALUE WIDTH [nm] | TRUE BORDER COLOR DIFFERENCE |
| 0.01182 | 0.137 | 0.053 | 461.8 | 24.0 | 0.006 |

| EMITTED LIGHT (G LIGHT) | | | | |
|---|---|---|---|---|
| TOTAL LUMINOUS FLUX OUTPUT EFFICIENCY | CIE1931x | CIE1931y | PEAK WAVELENGTH [nm] | HALF-VALUE WIDTH [nm] |
| 0.228 | 0.349 | 0.631 | 544.2 | 56.2 |

| FRONT-EMITTED LIGHT (G LIGHT) | | | | | |
|---|---|---|---|---|---|
| FRONT-DIRECTION POWER OUTPUT EFFICIENCY | CIE1931x | CIE1931y | PEAK WAVELENGTH [nm] | HALF-VALUE WIDTH [nm] | TRUE BORDER COLOR DIFFERENCE |
| 0.02354 | 0.336 | 0.642 | 540.8 | 54.2 | 0.017 |

| EMITTED LIGHT (B LIGHT) | | | | |
|---|---|---|---|---|
| TOTAL LUMINOUS FLUX OUTPUT EFFICIENCY | CIE1931x | CIE1931y | PEAK WAVELENGTH [nm] | HALF-VALUE WIDTH [nm] |
| 0.092 | 0.133 | 0.066 | 462.6 | 28.7 |

| FRONT-EMITTED LIGHT (B LIGHT) | | | | | |
|---|---|---|---|---|---|
| FRONT-DIRECTION POWER OUTPUT EFFICIENCY | CIE1931x | CIE1931y | PEAK WAVELENGTH [nm] | HALF-VALUE WIDTH [nm] | TRUE BORDER COLOR DIFFERENCE |
| 0.01057 | 0.136 | 0.060 | 461.8 | 27.0 | 0.006 |

| EMITTED LIGHT ||||| 
|---|---|---|---|---|
| TOTAL LUMINOUS FLUX OUTPUT EFFICIENCY | CIE1931x | CIE1931y | PEAK WAVELENGTH [nm] | HALF-VALUE WIDTH [nm] |
| 0.299 | 0.688 | 0.311 | 646.5 | 49.6 |

| FRONT-EMITTED LIGHT ||||||
|---|---|---|---|---|---|
| FRONT-DIRECTION POWER OUTPUT EFFICIENCY | CIE1931x | CIE1931y | PEAK WAVELENGTH [nm] | HALF-VALUE WIDTH [nm] | TRUE BORDER COLOR DIFFERENCE |
| 0.0343 | 0.685 | 0.315 | 640.2 | 48.3 | 0.005 |

| EMITTED LIGHT | | | | |
|---|---|---|---|---|
| TOTAL LUMINOUS FLUX OUTPUT EFFICIENCY | CIE1931x | CIE1931y | PEAK WAVELENGTH [nm] | HALF-VALUE WIDTH [nm] |
| 0.272 | 0.685 | 0.315 | 647.7 | 57.4 |

| FRONT-EMITTED LIGHT | | | | | |
|---|---|---|---|---|---|
| FRONT-DIRECTION POWER OUTPUT EFFICIENCY | CIE1931x | CIE1931y | PEAK WAVELENGTH [nm] | HALF-VALUE WIDTH [nm] | TRUE BORDER COLOR DIFFERENCE |
| 0.02709 | 0.682 | 0.318 | 641.6 | 55.4 | 0.004 |

Al/SiO2_135nm/ITO30nm/R120nm/Ca5nm/Ag8nm

| EMITTED LIGHT | | | | |
|---|---|---|---|---|
| TOTAL LUMINOUS FLUX OUTPUT EFFICIENCY | CIE1931x | CIE1931y | PEAK WAVELENGTH [nm] | HALF-VALUE WIDTH [nm] |
| 0.224 | 0.680 | 0.320 | 637.0 | 51.3 |

| FRONT-EMITTED LIGHT | | | | | |
|---|---|---|---|---|---|
| FRONT-DIRECTION POWER OUTPUT EFFICIENCY | CIE1931x | CIE1931y | PEAK WAVELENGTH [nm] | HALF-VALUE WIDTH [nm] | TRUE BORDER COLOR DIFFERENCE |
| 0.02593 | 0.675 | 0.325 | 630.9 | 49.6 | 0.007 |

Al/SiN105nm/ITO30nm/R120nm/Ca5nm/Ag8nm

| EMITTED LIGHT | | | | |
|---|---|---|---|---|
| TOTAL LUMINOUS FLUX OUTPUT EFFICIENCY | CIE1931x | CIE1931y | PEAK WAVELENGTH [nm] | HALF-VALUE WIDTH [nm] |
| 0.231 | 0.685 | 0.314 | 646.9 | 55.2 |

| FRONT-EMITTED LIGHT | | | | | |
|---|---|---|---|---|---|
| FRONT-DIRECTION POWER OUTPUT EFFICIENCY | CIE1931x | CIE1931y | PEAK WAVELENGTH [nm] | HALF-VALUE WIDTH [nm] | TRUE BORDER COLOR DIFFERENCE |
| 0.02516 | 0.683 | 0.317 | 641.7 | 53.8 | 0.004 |

| EMITTED LIGHT | | | | |
|---|---|---|---|---|
| TOTAL LUMINOUS FLUX OUTPUT EFFICIENCY | CIE1931x | CIE1931y | PEAK WAVELENGTH [nm] | HALF-VALUE WIDTH [nm] |
| 0.202 | 0.670 | 0.329 | 632.9 | 60.6 |

| FRONT-EMITTED LIGHT | | | | | |
|---|---|---|---|---|---|
| FRONT-DIRECTION POWER OUTPUT EFFICIENCY | CIE1931x | CIE1931y | PEAK WAVELENGTH [nm] | HALF-VALUE WIDTH [nm] | TRUE BORDER COLOR DIFFERENCE |
| 0.01923 | 0.667 | 0.333 | 629.1 | 59.0 | 0.005 |

Ag/SiO2_130nm/ITO30nm/G80nm/Ca5nm/Ag15nm
(GREEN-COLORED LIGHT)

| EMITTED LIGHT (G LIGHT) | | | | |
|---|---|---|---|---|
| TOTAL LUMINOUS FLUX OUTPUT EFFICIENCY | CIE1931x | CIE1931y | PEAK WAVELENGTH [nm] | HALF-VALUE WIDTH [nm] |
| 0.311 | 0.365 | 0.626 | 554.6 | 30.9 |

| FRONT-EMITTED LIGHT (G LIGHT) | | | | | |
|---|---|---|---|---|---|
| FRONT-DIRECTION POWER OUTPUT EFFICIENCY | CIE1931x | CIE1931y | PEAK WAVELENGTH [nm] | HALF-VALUE WIDTH [nm] | TRUE BORDER COLOR DIFFERENCE |
| 0.03809 | 0.334 | 0.653 | 548.3 | 31.4 | 0.041 |

| EMITTED LIGHT (B LIGHT) | | | | |
|---|---|---|---|---|
| TOTAL LUMINOUS FLUX OUTPUT EFFICIENCY | CIE1931x | CIE1931y | PEAK WAVELENGTH [nm] | HALF-VALUE WIDTH [nm] |
| 0.123 | 0.134 | 0.052 | 465.3 | 17.8 |

| FRONT-EMITTED LIGHT (B LIGHT) | | | | | |
|---|---|---|---|---|---|
| FRONT-DIRECTION POWER OUTPUT EFFICIENCY | CIE1931x | CIE1931y | PEAK WAVELENGTH [nm] | HALF-VALUE WIDTH [nm] | TRUE BORDER COLOR DIFFERENCE |
| 0.0916 | 0.137 | 0.045 | 463.2 | 17.8 | 0.008 |

| EMITTED LIGHT (G LIGHT) | | | | |
|---|---|---|---|---|
| TOTAL LUMINOUS FLUX OUTPUT EFFICIENCY | CIE1931x | CIE1931y | PEAK WAVELENGTH [nm] | HALF-VALUE WIDTH [nm] |
| 0.296 | 0.398 | 0.592 | 559.1 | 47.9 |

| FRONT-EMITTED LIGHT (G LIGHT) | | | | | |
|---|---|---|---|---|---|
| FRONT-DIRECTION POWER OUTPUT EFFICIENCY | CIE1931x | CIE1931y | PEAK WAVELENGTH [nm] | HALF-VALUE WIDTH [nm] | TRUE BORDER COLOR DIFFERENCE |
| 0.03157 | 0.373 | 0.614 | 553.6 | 47.4 | 0.033 |

| EMITTED LIGHT (G LIGHT) | | | | |
|---|---|---|---|---|
| TOTAL LUMINOUS FLUX OUTPUT EFFICIENCY | CIE1931x | CIE1931y | PEAK WAVELENGTH [nm] | HALF-VALUE WIDTH [nm] |
| 0.225 | 0.362 | 0.623 | 550.2 | 49.9 |

| FRONT-EMITTED LIGHT (G LIGHT) | | | | | |
|---|---|---|---|---|---|
| FRONT-DIRECTION POWER OUTPUT EFFICIENCY | CIE1931x | CIE1931y | PEAK WAVELENGTH [nm] | HALF-VALUE WIDTH [nm] | TRUE BORDER COLOR DIFFERENCE |
| 0.0218 | 0.339 | 0.642 | 544.3 | 47.6 | 0.030 |

Al/SiO2_35nm/ITO30nm/B80nm/Ca17nm (BLUE-COLORED LIGHT)

| EMITTED LIGHT (B LIGHT) | | | | |
|---|---|---|---|---|
| TOTAL LUMINOUS FLUX OUTPUT EFFICIENCY | CIE1931x | CIE1931y | PEAK WAVELENGTH [nm] | HALF-VALUE WIDTH [nm] |
| 0.065 | 0.138 | 0.053 | 460.5 | 25.1 |

| FRONT-EMITTED LIGHT (B LIGHT) | | | | | |
|---|---|---|---|---|---|
| FRONT-DIRECTION POWER OUTPUT EFFICIENCY | CIE1931x | CIE1931y | PEAK WAVELENGTH [nm] | HALF-VALUE WIDTH [nm] | TRUE BORDER COLOR DIFFERENCE |
| 0.00963 | 0.140 | 0.049 | 459.5 | 24.6 | 0.005 |

| EMITTED LIGHT (G LIGHT) | | | | |
|---|---|---|---|---|
| TOTAL LUMINOUS FLUX OUTPUT EFFICIENCY | CIE1931x | CIE1931y | PEAK WAVELENGTH [nm] | HALF-VALUE WIDTH [nm] |
| 0.228 | 0.349 | 0.631 | 544.2 | 56.2 |

| FRONT-EMITTED LIGHT (G LIGHT) | | | | | |
|---|---|---|---|---|---|
| FRONT-DIRECTION POWER OUTPUT EFFICIENCY | CIE1931x | CIE1931y | PEAK WAVELENGTH [nm] | HALF-VALUE WIDTH [nm] | TRUE BORDER COLOR DIFFERENCE |
| 0.0254 | 0.336 | 0.642 | 540.8 | 54.2 | 0.017 |

ITO60nm/B80nm/Ca15nm
(BLUE-COLORED LIGHT)

| EMITTED LIGHT (B LIGHT) | | | | |
|---|---|---|---|---|
| TOTAL LUMINOUS FLUX OUTPUT EFFICIENCY | CIE1931x | CIE1931y | PEAK WAVELENGTH [nm] | HALF-VALUE WIDTH [nm] |
| 0.092 | 0.133 | 0.066 | 462.6 | 28.7 |

| FRONT-EMITTED LIGHT (B LIGHT) | | | | | |
|---|---|---|---|---|---|
| FRONT-DIRECTION POWER OUTPUT EFFICIENCY | CIE1931x | CIE1931y | PEAK WAVELENGTH [nm] | HALF-VALUE WIDTH [nm] | TRUE BORDER COLOR DIFFERENCE |
| 0.01057 | 0.136 | 0.060 | 461.8 | 27.0 | 0.006 |

LIGHT-EMITTING DEVICE, IMAGE FORMING APPARATUS, DISPLAY DEVICE, AND ELECTRONIC APPARATUS

This application is a Divisional of U.S. patent application Ser. No. 11/753,206 filed May 24, 2007. The reference is hereby incorporated in its entirety.

BACKGROUND

1. Technical Field

The present invention relates to a light-emitting device, an image forming apparatus, a display device, and an electronic apparatus.

2. Related Art

In a light-emitting device having EL (electroluminescent) elements, such as organic EL elements or inorganic EL elements, it is necessary to make a band of an emission spectrum narrow and to increase an amount of emitted light for the purpose of facilitating many applications thereof. As a light-emitting device that meets the above requirements, there is a light-emitting device having microcavities formed by arranging a dielectric mirror between EL elements and a substrate (refer to Japanese Patent No. 3274527). The light-emitting device is of a bottom emission type, and light from EL elements is transmitted through the substrate and is then emitted.

In a light-emitting device having EL elements, a substrate on which the EL elements are arranged is very thick. Therefore, from the point of view of increasing an amount of emitted light, a top-emission-type light-emitting device that causes light from EL elements to be emitted toward a side opposite to a substrate is preferred rather than a bottom-emission-type light-emitting device. In addition, even in the top-emission-type light-emitting device, it is necessary to further increase the amount of emitted light. In addition, in the case of using a light-emitting device having organic EL elements as an exposure unit of an electrophotographic image forming apparatus or as a display device that displays an image, it is necessary to further narrow a band of an emission spectrum. Here, a case is considered in which a technique disclosed in Japanese Patent No. 3274527 is applied to a top-emission-type light-emitting device.

However, in the case of the top-emission-type light-emitting device to which the technique disclosed in Japanese Patent No. 3274527 is applied, it is necessary to form a dielectric mirror on EL elements formed on a substrate in manufacturing the top-emission-type light-emitting device, which may cause the EL elements (for example, light-emitting layer) to be greatly damaged. Since the light emission characteristics of the EL elements that are greatly damaged noticeably deteriorate, it is difficult to apply the technique disclosed in Japanese Patent No. 3274527 to the top-emission-type light-emitting device.

SUMMARY

An advantage of some aspects of the invention is that it provides a top-emission-type light-emitting device capable of making a band of an emission spectrum narrow or increasing an amount of emitted light, an image forming apparatus, a display device, and an electronic apparatus.

According to an aspect of the invention, a light-emitting device includes: a substrate; a light reflection layer that is formed on the substrate and reflects light; a first electrode that is formed on the light reflection layer and transmits light; a light-emitting layer that is formed on the first electrode and emits light; a second electrode that is formed on the light-emitting layer and transmits a part of light from the light-emitting layer and reflects the rest of the light from the light-emitting layer; and a conductive transflective layer that is formed on the second electrode and that transmits a part of light from the second electrode and reflects the rest of the light from the second electrode. A work function of the second electrode is 4 eV (electron volts) or less. The conductive transflective layer is formed of a metal material having a higher optical reflectance than the second electrode.

In the light-emitting device described above, light emitted from the light-emitting layer is transmitted through the second electrode and the conductive transflective layer. Therefore, the light-emitting device can serve as a top-emission-type light-emitting device. Further, in the light-emitting device described above, it is possible to realize a resonance structure in which the light emitted from the light-emitting layer moves back and forth between the light reflection layer and the conductive transflective layer so as to increase the intensity of light having a specific wavelength. That is, it is possible to form microcavities in the light-emitting device described above. Thus, according to the aspect of the invention, it is possible to provide a top-emission-type light-emitting device in which a microcavity can be formed without forming a dielectric mirror on the light-emitting layer. As described above, according to the aspect of the invention, it is possible to provide a top-emission-type light-emitting device capable of making a band of an emission spectrum narrow or increasing an amount of emitted light.

Moreover, in the light-emitting device described above, the conductive transflective layer having a higher optical reflectance than the second electrode is laminated on the second electrode whose work function is 4 eV or less, such that most of the required reflection is realized by the conductive transflective layer not by the second electrode. With such configuration described above, it is possible to reduce light absorbed in a layer above the second electrode as compared with a configuration in which the second electrode having a work function of 4 eV or less is formed thick and the conductive transflective layer is not provided. Accordingly, in the light-emitting device described above, an increase in the amount of emitted light is realized.

In addition, the first electrode, the light-emitting layer, and the second electrode form a light-emitting element. As the light-emitting element, an EL element that emits light through an excited state of excitons may be exemplified. EL elements include an organic EL element having a light-emitting layer formed of an organic material or an inorganic EL element having a light-emitting layer formed of an inorganic material.

In the light-emitting device according to the aspect of the invention, it is preferable that the metal material include silver, magnesium, or aluminum. By using the metal materials, the effects described above can be reliably obtained. In addition, aluminum is more suitable than silver and magnesium is much more suitable than aluminum from the point of view of making a band of the emission spectrum narrow, and magnesium is more suitable than aluminum and silver is much more suitable than magnesium from the point of view of increasing the amount of emitted light.

Further, in the light-emitting device according to the aspect of the invention, it is preferable that a material used to form the light reflection layer include silver, magnesium, or aluminum. By using the metal materials, the effects described above can be reliably obtained. In addition, a material including silver is preferable from the point of view of making a band of the emission spectrum narrow and increasing the amount of emitted light and a material including aluminum is preferable from the point of view of manufacturing a light-emitting device more easily.

Furthermore, according to another aspect of the invention, a light-emitting device includes: a substrate; a reflective layer that is formed on the substrate and reflects light; a transparent layer that is formed on the reflective layer and transmits light; a first electrode that is formed on the transparent layer and transmits light; a light-emitting layer that is formed on the first electrode and emits light; and a second electrode that is formed on the light-emitting layer and transmits a part of light from the light-emitting layer and reflects the rest of the light from the light-emitting layer. The transparent layer is formed of a material having a lower coefficient of extinction than the first electrode, and a work function of the second electrode is 4 eV (electron volts) or less.

In the light-emitting device described above, light emitted from the light-emitting layer is transmitted through the second electrode. Therefore, the light-emitting device can serve as a top-emission-type light-emitting device. In addition, in the light-emitting device described above, it is possible to realize a resonance structure in which the light emitted from the light-emitting layer moves back and forth between the reflective layer and the second electrode or a layer on the second electrode so as to increase the intensity of light having a specific wavelength. That is, it is possible to form microcavities in the light-emitting device described above. Thus, according to the aspect of the invention, it is possible to provide a top-emission-type light-emitting device in which a microcavity can be formed without forming a dielectric mirror on the light-emitting layer. As described above, according to the aspect of the invention, it is possible to provide a top-emission-type light-emitting device capable of making a band of an emission spectrum narrow or increasing an amount of emitted light.

Moreover, in the light-emitting device according to the aspect of the invention, the transparent layer is provided between the reflective layer and the first electrode. Accordingly, by making the transparent layer thick without making the first electrode thick, it is possible to cause a distance between the reflective layer and the second electrode or the layer on the second electrode and a dominant emission wavelength of light emitted from the light-emitting layer to satisfy a predetermined relationship such that light having a dominant emission wavelength can sufficiently resonate. A coefficient of extinction of a material used to form the transparent layer is smaller than a coefficient of extinction of a material used to form the first electrode. Accordingly, it is efficient to make the transparent layer thick rather than making the first electrode thick in order to suppress absorption of light. That is, in the light-emitting device described above, a further increase in the amount of emitted light is realized.

In addition, the first electrode, the light-emitting layer, and the second electrode form a light-emitting element. As the light-emitting element, an EL element that emits light through an excited state of excitons may be exemplified. EL elements include an organic EL element having a light-emitting layer formed of an organic material or an inorganic EL element having a light-emitting layer formed of an inorganic material.

Furthermore, in the light-emitting device according to the aspect of the invention, it is preferable that a material used to form the transparent layer be silicon dioxide or silicon nitride. In addition, it is preferable that a material used to form the reflective layer include silver, magnesium, or aluminum. In this way, the effects described above can be reliably obtained. In addition, a material including silver is preferable from the point of view of making a band of the emission spectrum narrow and increasing the amount of emitted light and a material including aluminum is preferable from the point of view of manufacturing a light-emitting device more easily.

Furthermore, in the light-emitting device according to the aspect of the invention, preferably, the thickness of the first electrode is less than 60 nm, and the thickness of one or both of the transparent layer and the light-emitting layer is set such that a distance between the reflective layer and the second electrode and a dominant emission wavelength of light emitted from the light-emitting layer satisfy a predetermined relationship. If the thickness of the first electrode is less than 60 nm, it is necessary to make at least one of the transparent layer, the light-emitting layer, and the second electrode thick. From the point of view of increasing the amount of emitted light, it is preferable to make one or both of the transparent layer and the light-emitting layer thick rather than making the second electrode thick. As is apparent from the above description, in the light-emitting device described above, a further increase in the amount of emitted light is realized. In addition, the predetermined relationship referred herein is a condition in which light having a dominant emission wavelength moves back and forth between the reflective layer and the second electrode so as to be sufficiently amplified and is then emitted from the second electrode. The predetermined relationship approximately matches the resonance condition described above. That is, satisfying the predetermined relationship is approximately equivalent to satisfying the resonance condition.

Furthermore, in the light-emitting device according to the aspect of the invention, it is preferable to further include a conductive transflective layer that is formed on the second electrode and that transmits a part of light from the second electrode and reflects the rest of the light from the second electrode. In addition, preferably, the conductive transflective layer is formed of a metal material having a higher optical reflectance than the second electrode. In the configuration described above, it is possible to reduce light absorbed in a layer above the second electrode as compared with a configuration in which the second electrode having a work function of 4 eV or less is formed thick and the conductive transflective layer is not provided. Accordingly, in the light-emitting device described above, a further increase in the amount of emitted light is realized.

Furthermore, in the light-emitting device according to the aspect of the invention, it is preferable that a material used to form the conductive transflective layer include silver, magnesium, or aluminum. In this way, the effects described above can be reliably obtained. In addition, aluminum is more suitable than silver and magnesium is much more suitable than aluminum from the point of view of making a band of the emission spectrum narrow, and magnesium is more suitable than aluminum and silver is much more suitable than magnesium from the point of view of increasing the amount of emitted light.

Furthermore, in the light-emitting device according to the aspect of the invention, preferably, the thickness of the first electrode is less than 60 nm, and the thickness of at least one of the transparent layer, the light-emitting layer, and the conductive transflective layer is set such that a distance between the reflective layer and the conductive transflective layer and a dominant wavelength of light emitted from the light-emitting layer satisfy a predetermined relationship. If the thickness of the first electrode is less than 60 nm, it is necessary to make at least one of the transparent layer, the light-emitting layer, the second electrode, and the conductive transflective layer thick. From the point of view of increasing the amount of emitted light, it is preferable to make at least one of the transparent layer, the light-emitting layer, and the conductive transflective layer thick rather than making the second electrode thick. As is apparent from the above description, in the light-emitting device described above, a further increase in the amount of emitted light is realized. In addition, the predetermined relationship referred herein is a condition in which light having a dominant emission wavelength moves back and forth between the reflective layer and the conductive transflective layer so as to be sufficiently amplified and is then emitted from the conductive transflective layer. The predetermined relationship approximately matches the resonance condition described above. That is, satisfying the predetermined relationship is approximately equivalent to satisfying the resonance condition.

Furthermore, according to still another aspect of the invention, there is provided an electronic apparatus having the light-emitting device described above. For example, there is an image forming apparatus, which includes the light-emitting device described above and an image carrier and in which the image carrier is electrically charged, light from the light-emitting device is illuminated onto an electrically charged surface of the image carrier to form a latent image, toner is adhered onto the latent image to form a developed image, and the developed image is transferred onto another medium, or a display device, which includes the light-emitting device described above and in which an image is displayed by receiving image data used to display the image and causing the light-emitting layer to emit light in brightness corresponding to the image data. In the electronic apparatus described above, various kinds of effects (for example, improvement in the quality of an image formed by the image forming apparatus or improvement in the quality of an image displayed by the display device) resulting from making the band of the emission spectrum of the light-emitting device or increasing the amount of emitted light are obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
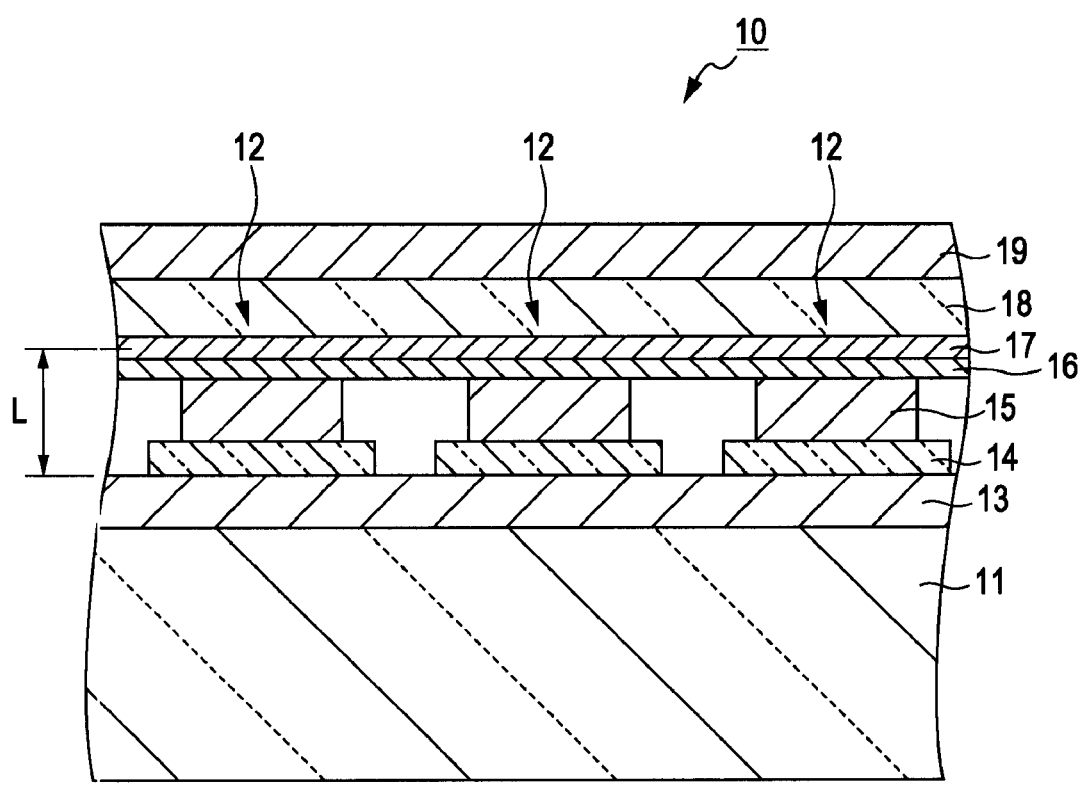
FIG. 1 is a cross-sectional view illustrating a part of a light-emitting device according to a first embodiment of the invention.

Hereinafter, embodiments of the invention will be described with reference to the accompanying drawings. In the following description, the scale of each layer or member is adjusted in order to have a recognizable size in the drawings.

First Embodiment

FIG. 1 is a cross-sectional view illustrating a part of a light-emitting device 10 according to a first embodiment of the invention. The light-emitting device 10 has a plurality of light-emitting elements 12 arranged on a substrate 11. In FIG. 1, only three light-emitting elements 12 are shown. Each of the light-emitting elements 12 is an organic EL element, that is, an OLED (organic light-emitting diode) element. That is, the light-emitting device 10 is an organic EL device.

The substrate 11 is formed of a glass, for example, and the thickness of the substrate 11 is 500 μm, for example. On the substrate 11, a light reflection layer 13 from which light is totally reflected is formed. The light reflection layer 13 allows light to resonate and is formed of a material having a high optical reflectance. In addition, an upper surface of the light reflection layer 13 is smooth and the thickness of the light reflection layer 13 is 200 nm, for example. Specifically, the material used to form the light reflection layer 13 is silver. However, the present embodiment may be modified such that aluminum is used or an alloy containing one or both of silver and aluminum is also used.

A plurality of light-emitting elements 12 are formed on the light reflection layer 13. Each of the light-emitting elements 12 has a transparent electrode (first electrode) 14 formed on the light reflection layer 13, a light-emitting layer 15 that is formed on the transparent electrode 14 and that has a thickness of 170 nm, and a transflective electrode (second electrode) 16 formed on the light-emitting layer 15. The transparent electrode 14 is an electrode that allows incident light to be transmitted therethrough. In addition, the transparent electrode 14 is formed of ITO (indium tin oxide) having a refractive index of 1.7 and the thickness of the transparent electrode 14 is 125 nm.

The light-emitting layer 15 is formed by laminating a light-emitting layer, which emits light through excitation of excitons formed by recombination of holes and electrons, on a hole injection layer through which holes are injected into the light-emitting layer. As is apparent from the above, in the present embodiment, each transparent electrode 14 serves as an anode and the transflective electrode 16 serves as a cathode. However, the present embodiment may be modified such that the transparent electrode 14 serves as a cathode and the transflective electrode 16 serves as an anode. The thickness of the hole injection layer is 50 nm and the refractive index of a material used to form the hole injection layer is 1.45, for example. The thickness of the light-emitting layer on the hole injection layer is 120 nm and the refractive index of a material used to form the light-emitting layer is 1.67, for example. In addition, a partition wall for partitioning the light-emitting layer 15 in each light-emitting element 12 may be formed or not formed. Moreover, the present embodiment may be modified such that the light-emitting layer 15 does not include the hole injection layer or the light-emitting layer 15 includes a hole transport layer, an electron injection layer, or an electron transport layer.

The transflective electrode 16 is an electrode that is common to all of the light-emitting layers 15 and has a thickness of 5 nm. The transflective electrode 16 covers all of the light-emitting layers 15. In addition, the transflective electrode 16 serves as a half mirror that allows light to resonate. That is, the transflective electrode 16 causes a part of light from the light-emitting layer 15 to be transmitted therethrough and the rest of the light to be reflected therefrom. Furthermore, the transflective electrode 16 is formed of a metal that allows electrons to be injected thereinto, and a work function of the transflective electrode 16 is 4 eV (electron volts) or less. Specifically, the material used to form the transflective electrode 16 is calcium. However, the present embodiment may be modified such that lithium, strontium, barium, cesium, ytterbium, or samarium can also be used to form the transflective electrode 16.

Furthermore, a conductive transflective layer 17 that is translucent is formed on the transflective electrode 16. The conductive transflective layer 17 causes a part of light from the transflective electrode 16 to be transmitted therethrough and the rest of the light to be reflected therefrom and covers the transflective electrode 16. Accordingly, the conductive transflective layer 17 is formed of a metal having a higher optical reflectance than the transflective electrode 16 and a lower coefficient of extinction than the transflective electrode 16, and the thickness of the conductive transflective layer 17 is 8 nm. Specifically, the material used to form the conductive transflective layer 17 is silver. However, the present embodiment may be modified such that the conductive transflective layer 17 can be formed of magnesium, platinum, or aluminum.

A transparent auxiliary electrode 18 is formed on the conductive transflective layer 17. The transparent auxiliary electrode 18 is a transparent electrode that assists the conductivity of the transflective electrode 16 and covers the conductive transflective layer 17. The transparent auxiliary electrode 18 is formed of ITO. However, the present embodiment may be modified such that the transparent auxiliary electrode 18 is formed of indium zinc oxide or indium gallium oxide. The thickness of the transparent auxiliary electrode 18 is 100 nm. However, the thickness of the transparent auxiliary electrode 18 may be arbitrarily set within a range in which sufficient conductivity is realized. Moreover, in a portion not overlapping the light-emitting elements 12, a metal auxiliary electrode may be provided on the transparent auxiliary electrode 18 or instead of the transparent auxiliary electrode 18. The metal auxiliary electrode is a metal electrode that assists the conductivity of the transflective electrode 16 and is formed of a metal that is opaque and has a high conductivity.

A sealing layer 19 is formed on the transparent auxiliary electrode 18. The sealing layer 19 serves to protect all of the light-emitting elements 12 against the air and is formed of a transparent inorganic material. Therefore, outgoing light resulting from emission in the light-emitting layer 15 is emitted through the transflective electrode 16, the conductive transflective layer 17, the transparent auxiliary electrode 18, and the sealing layer 19. On the other hand, since the light reflection layer 13 exists, the outgoing light is not emitted from the substrate 11. That is, the light-emitting device 10 is a top-emission-type light-emitting device in which light from the light-emitting elements 12 is emitted toward a side opposite to the substrate 11. In addition, a film sealing method in which the sealing layer 19 is formed by film formation is adopted in the present embodiment. However, the present embodiment may be modified such that other known sealing methods can be used.

Each of the light-emitting elements 12, the light reflection layer 13, and the conductive transflective layer 17 form a resonance structure, that is, a microcavity. In this case, a resonance distance L, which is a distance between the light reflection layer 13 and the conductive transflective layer 17, and the thickness and refractive index of each layer within a microcavity are set to approximately satisfy a resonance condition that is a condition in which light having a wavelength of $\lambda$ moves back and forth between the light reflection layer 13 and the conductive transflective layer 17 and the light having a wavelength of $\lambda$ is amplified to be then emitted from the light-emitting device 10.

Specifically, in each microcavity, the resonance distance L is set to satisfy $d=\frac{3}{4}\lambda$ assuming that an optical path length between the light reflection layer 13 and the conductive transflective layer 17 is 'd'. $\lambda$ is a dominant emission wavelength of light emitted from the light-emitting layer 15. Specifically, $\lambda$ is 630 nm. Therefore, 'L' is set such that 'd' is approximately equal to $\frac{3}{4} \cdot 630 = 472.5$ nm. In addition, the above conditional expression ($d=\frac{3}{4} \cdot \lambda$) is applied to a case of three-dimensional light. However, in the case in which light having different dimensions is applied in a modification of the present invention, a conditional expression different from the above expression is used.

Figures 2, 3:
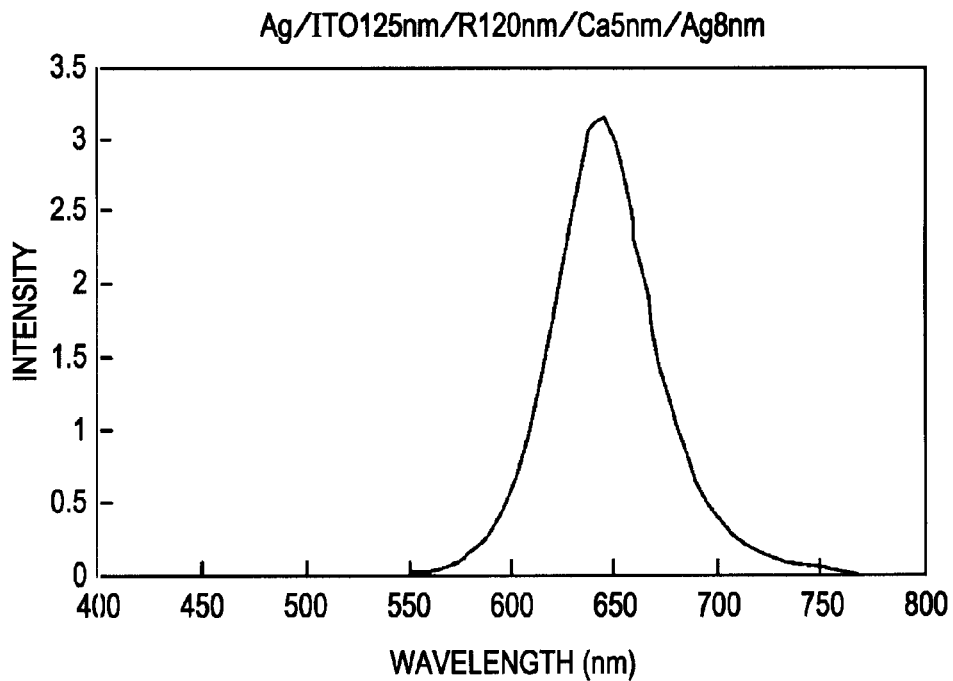
FIG. 2 is a view illustrating the spectrum of light (emitted light) that is emitted from light-emitting elements of the light-emitting device and is then emitted from the light-emitting device.
FIG. 3 is a view illustrating the characteristics of the emitted light in FIG. 2.

FIG. 2 is a view illustrating the spectrum of light (emitted light) that is emitted from the light-emitting elements 12 and is then emitted from the light-emitting device 10. FIG. 3 is a view illustrating the characteristics of the emitted light in FIG. 2. As shown in the drawings, the half-value width of the spectrum of emitted light is set to 52.5 nm. The half-value width is equal to or smaller than a half-value width of a spectrum of emitted light in a known top-emission-type light-emitting device (known device). That is, in the light-emitting device 10, a narrow band of an emission spectrum is realized.

Furthermore, a total luminous flux output efficiency, which is the ratio of emitted light beams to all light beams outgoing from the light-emitting elements 12, is 0.301. This efficiency is higher than that in a known device. That is, in the light-emitting device 10, the amount of emitted light increases. Moreover, CIE1931x which is the 'x' value of chromaticity of emitted light based on CIE1931 is 0.685, and CIE1931y which is the 'y' value of the chromaticity of the emitted light based on CIE1931 is 0.315.

Moreover, in the case of light (forward-emitted light), which propagates in the direction (forward direction) within a range in which an angle between the light and an imaginary line normal to a light-emitting surface is ±15°, of the emitted light, the half-value width thereof is 51.5 nm. In addition, a forward-direction light intensity output efficiency, which is the ratio of the light intensity of the forward-emitted light to the light intensity of all light beams outgoing from the light-emitting elements 12, is 0.02746. That is, in the light-emitting device 10, a narrow band of an emission spectrum is realized and an increase in the amount of emitted light is achieved even in the case of the forward-emitted light.

In addition, a true border color difference, which is a color difference of emitted light (forward-border-emitted light) propagating within a range of ±15° described above with respect to emitted light (straight-forward-emitted light) propagating in the straight forward direction, is 0.004. This is a sufficiently small value and indicates that the chromaticity of emitted light negligibly depends on the viewing direction.

In addition, the true border color difference is a positive square root of a sum of the square of a difference between CIE1931x of the straight-forward-emitted light and CIE1931x of the forward-border-emitted light and the square of a difference between CIE1931y of the straight-forward-emitted light and CIE1931y of the forward-border-emitted light.

Figures 4, 5:
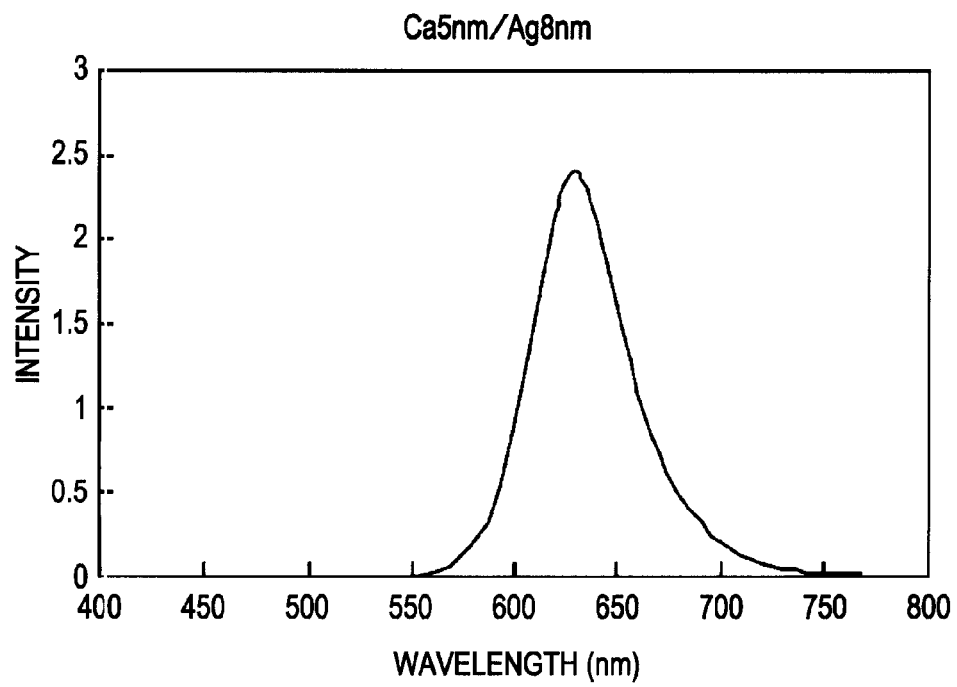
FIG. 4 is a view illustrating the spectrum of emitted light from a light-emitting device according to a modified example (first modified example) of the light-emitting device.
FIG. 5 is a view illustrating the characteristics of the emitted light in FIG. 4.

FIG. 4 is a view illustrating the spectrum of emitted light from a light-emitting device according to a modified example (first modified example) of the light-emitting device 10. FIG. 5 is a view illustrating the characteristics of the emitted light in FIG. 4. The light reflection layer 13 of the light-emitting device is formed of aluminum. In the light-emitting device, the half-value width of a spectrum of emitted light is 53.3 nm and the total luminous flux output efficiency is 0.212. In addition, as for forward-emitted light, the half-value width thereof is 52.0 nm and the forward-direction light intensity output efficiency is 0.02166. That is, in the light-emitting device, a narrow band of an emission spectrum is realized and an increase in the amount of emitted light is achieved.

As is apparent from comparison of the half-value widths, total luminous flux output efficiencies, and forward-direction light intensity output efficiencies between the light-emitting device 10 and the light-emitting device according to the first modified example, silver is more suitable than aluminum as a material used to form the light reflection layer 13 from the point of view of making a band of the emission spectrum narrow and increasing the amount of emitted light. On the other hand, from the point of view of manufacturing a light-emitting device more easily, aluminum is more suitable than silver.

Figures 6, 7:
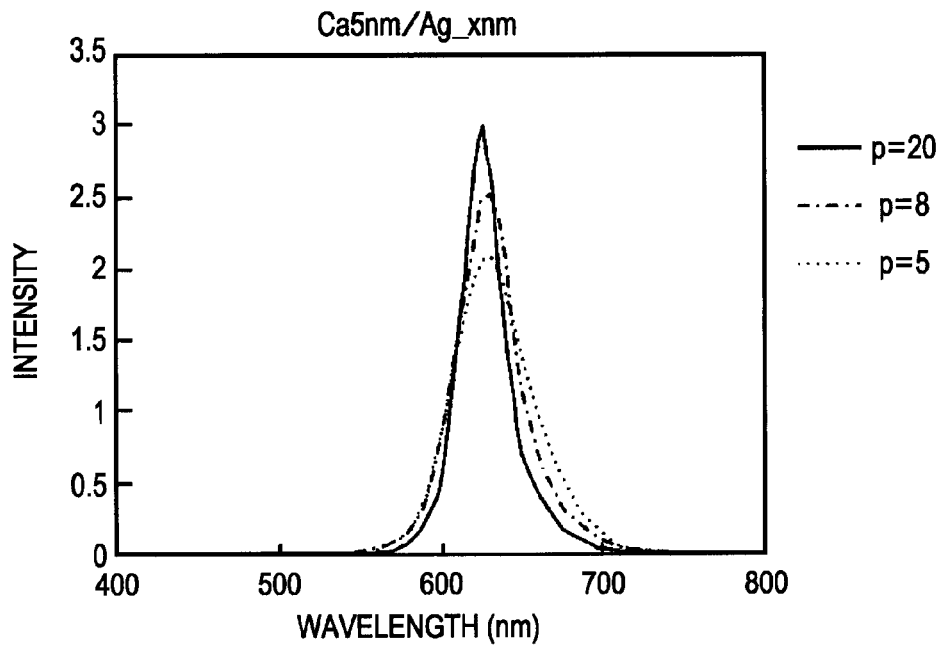
FIG. 6 is a view illustrating the spectrum of emitted light when changing the thickness (p) of a conductive transflective layer in the light-emitting device according to the first modified example.
FIG. 7 is a view illustrating the characteristics of the emitted light in FIG. 6.

FIG. 6 is a view illustrating the spectrum of emitted light in a case where the thickness (p) of the conductive transflective layer 17 is changed in the light-emitting device according to the first modified example. FIG. 7 is a view illustrating the characteristics of the emitted light shown in FIG. 6. In FIG. 6, only spectrums corresponding to cases of p=5, 8, 20 nm are shown. As is apparent from FIGS. 6 and 7, as the thickness of the conductive transflective layer 17 increases, the half-value width decreases and the forward-direction light intensity output efficiency decreases. In contrast, as the thickness of the conductive transflective layer 17 decreases, the half-value width increases and the forward-direction light intensity output efficiency increases. In the case of p=8 nm, the forward-direction light intensity output efficiency is largest. A light-emitting device in this case corresponds to the light-emitting device according to the first modified example.

Figures 8, 9:
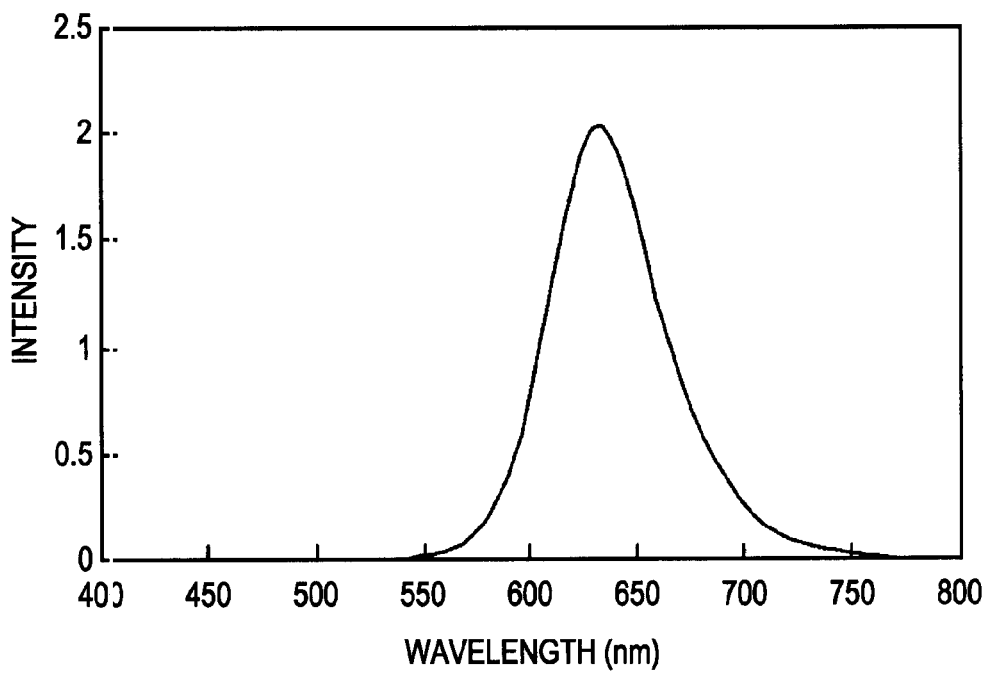
FIG. 8 is a view illustrating the spectrum of emitted light from a light-emitting device in a known example (first known example) to be compared with the light-emitting device according to the first modified example.
FIG. 9 is a view illustrating the characteristics of the emitted light in FIG. 8.

FIG. 8 is a view illustrating the spectrum of emitted light from a light-emitting device in a known example (first known example) to be compared with the light-emitting device according to the first modified example. FIG. 9 is a view illustrating the characteristics of the emitted light in FIG. 8. In the first known example, the transflective electrode 16 in the light-emitting device according to the first modified example is made thick so that the conductive transflective layer 17 is not needed. Specifically, in the light-emitting device in the first known example, the transflective electrode 16 is formed of calcium and the thickness of the transflective electrode 16 is 15 nm.

In the light-emitting device, the half-value width of a spectrum of emitted light is 60.6 nm and the total luminous flux output efficiency is 0.202. In addition, as for forward-emitted light, the half-value width thereof is 59.0 nm and the forward-direction light intensity output efficiency is 0.01923. When comparing these values with those in the light-emitting device according to the first modified example, it can be seen that the light-emitting device according to the first modified example is better than the light-emitting device in the known example in terms of both making the band of the emission spectrum narrow and increasing the amount of emitted light. Accordingly, from the point of view of making the band of the emission spectrum narrow and increasing the amount of emitted light, it can be said that a configuration, in which the conductive transflective layer 17 having a high optical reflectance and a low coefficient of extinction is laminated on the thin transflective electrode 16, is better than a configuration having only the thick transflective electrode 16.

Figures 10, 11:
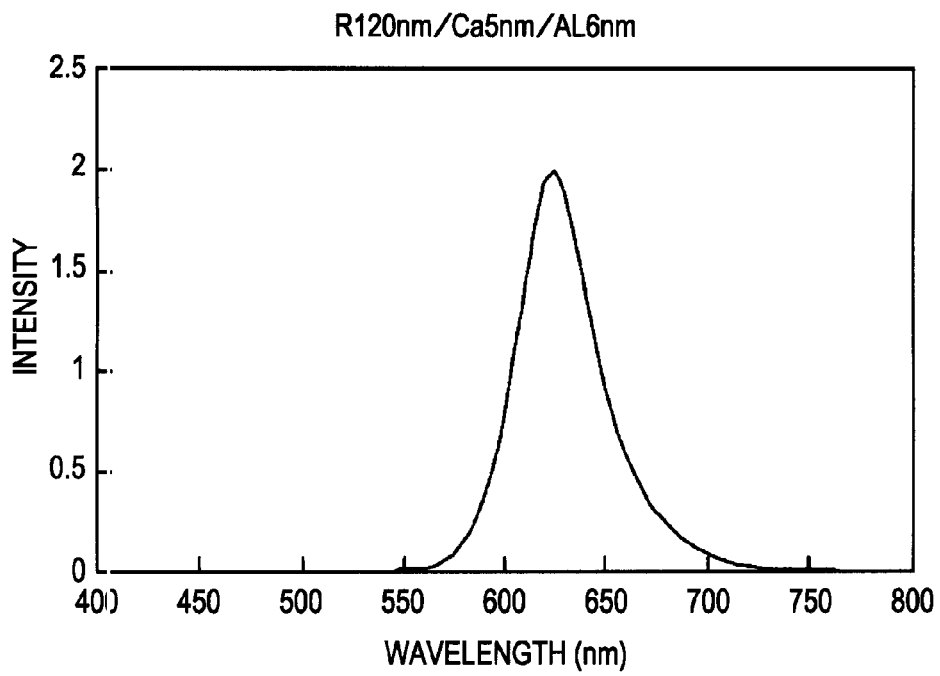
FIG. 10 is a view illustrating the spectrum of emitted light from a light-emitting device according to a modified example (second modified example) of the light-emitting device according to the first modified example.
FIG. 11 is a view illustrating the characteristics of the emitted light in FIG. 10.

FIG. 10 is a view illustrating the spectrum of emitted light from a light-emitting device according to a modified example (second modified example) of the light-emitting device according to the first modified example. FIG. 11 is a view illustrating the characteristics of the emitted light in FIG. 10. In this light-emitting device, the conductive transflective layer 17 is formed of aluminum and the thickness of the conductive transflective layer 17 is 6 nm. In the light-emitting device, the half-value width of a spectrum of emitted light is 44.5 nm and the total luminous flux output efficiency is 0.136. In addition, as for forward-emitted light, the half-value width thereof is 44.1 nm and the forward-direction light intensity output efficiency is 0.01448. That is, in the light-emitting device, a narrow band of an emission spectrum is realized and an increase in the amount of emitted light is achieved.

Figures 12, 13:
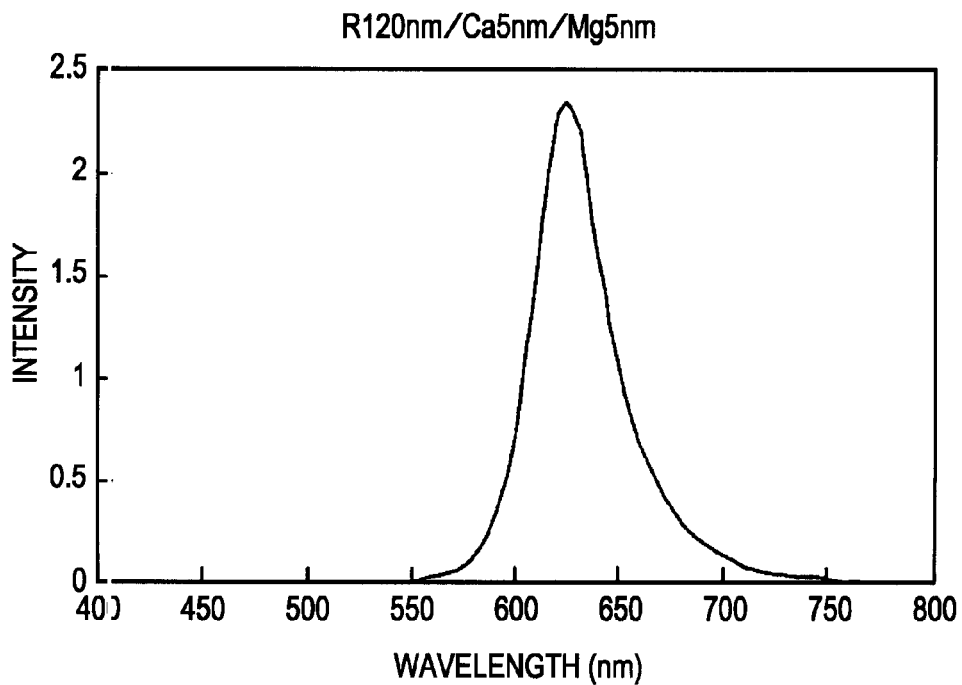
FIG. 12 is a view illustrating the spectrum of emitted light from a light-emitting device according to another modified example (third modified example) of the light-emitting device according to the first modified example.
FIG. 13 is a view illustrating the characteristics of the emitted light in FIG. 12.

FIG. 12 is a view illustrating the spectrum of emitted light from a light-emitting device according to another modified example (third modified example) of the light-emitting device according to the first modified example. FIG. 13 is a view illustrating the characteristics of the emitted light in FIG. 12. In this light-emitting device, the conductive transflective layer 17 is formed of magnesium and the thickness of the conductive transflective layer 17 is 5 nm. In the light-emitting device, the half-value width of a spectrum of emitted light is 41.0 nm and the total luminous flux output efficiency is 0.137. In addition, as for forward-emitted light, the half-value width thereof is 40.8 nm and the forward-direction light intensity output efficiency is 0.01589. That is, in the light-emitting device, a narrow band of an emission spectrum narrow is realized and an increase in the amount of emitted light is achieved.

As is apparent from comparison of the half-value widths, total luminous flux output efficiencies, and forward-direction light intensity output efficiencies among the light-emitting devices according to the first to third modified examples, aluminum is more suitable than silver and magnesium is much more suitable than aluminum as a material used to form the light reflection layer 17 from the point of view of making a band of the emission spectrum narrow. On the other hand, from the point of view of increasing the amount of emitted light, magnesium is more suitable than aluminum and silver is much more suitable than magnesium as a material used to form the light reflection layer 17.

Second Embodiment

Figure 14:
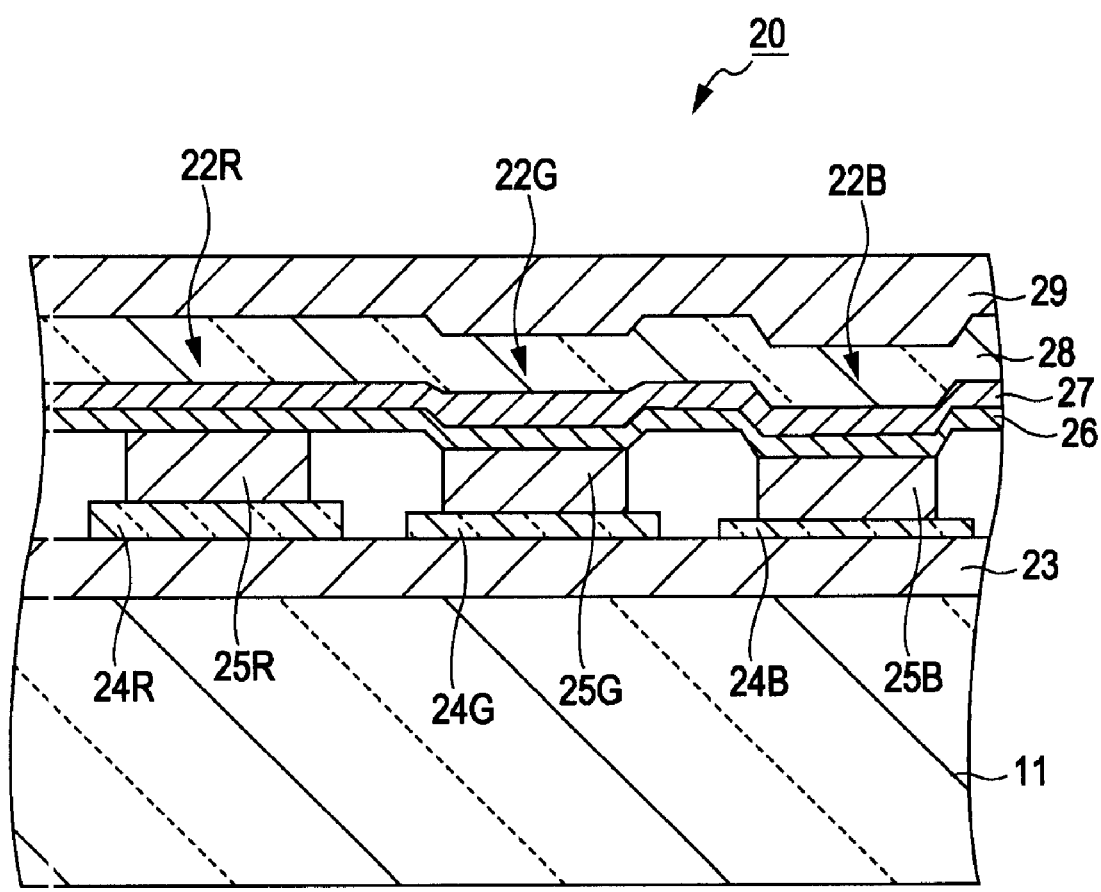
FIG. 14 is a cross-sectional view illustrating a part of a light-emitting device according to a second embodiment of the invention.

FIG. 14 is a cross-sectional view illustrating a part of a light-emitting device 20 according to a second embodiment of the invention. The second embodiment is different from the first embodiment in that a full color image can be displayed. The light-emitting device 20 is suitable for display of a full color image and has a plurality of pixels arranged in a matrix on a light reflection layer 23. Each of the pixels includes a light-emitting element 22R that emits 'R' light corresponding to a color close to a red color, a light-emitting element 22G that emits 'G' light corresponding to a color close to a green color, and a light-emitting element 22B that emits 'B' light corresponding to a color close to a blue color. Although the light emitting elements 22R, 22G, and 22B are described as emitting red color, green color, and blue color, respectively, it should be noted that elements that emit light near to these colors could be used instead.

The configuration below the light-emitting elements 22R, 22G, and 22B is the same as the configuration below the light-emitting element 12 in the light-emitting device 10 except that the light reflection layer 23 is provided instead of the light reflection layer 13. The light reflection layer 23 is different from the light reflection layer 13 in that the light reflection layer 23 is formed of aluminum.

Each of the light-emitting elements 22R, 22G, and 22B has the same configuration as the light-emitting element 12 in the light-emitting device 10. For example, the light-emitting element 22R is configured to include a transparent electrode 24R, a transflective electrode 26, and a light-emitting layer 25R interposed between the transparent electrode 24R and the transflective electrode 26. Materials and thicknesses of the transparent electrode 24R, light-emitting layer 25R, and transflective electrode 26 are equal to those of the transparent electrode 14, light-emitting layer 15, and transflective electrode 16.

In this case, the dominant emission wavelength of light emitted from a light-emitting layer 25G of the light-emitting element 22G is 550 nm, and the dominant emission wavelength of light emitted from a light-emitting layer 25B of the light-emitting element 22B is 480 nm. In addition, the thickness of a light-emitting layer on a hole injection layer included in the light-emitting layer 25G and the light-emitting layer 25B is 80 nm. Moreover, the thickness of the transparent electrode 24G of the light-emitting element 22G is set to 115 nm and the thickness of the transparent electrode 24B of the light-emitting element 22B is set to 60 nm so that a resonance condition is approximately satisfied. As a result, as shown in FIG. 14, upper surfaces of the light-emitting layers are not at the same height, such that the transflective electrode 26 has unevenness.

The configuration above the light-emitting elements 22R, 22G, and 22B is the same as the configuration above the light-emitting elements 12 in the light-emitting device 10 except that there is unevenness along the transflective electrode 26. That is, a conductive transflective layer 27 that has a thickness of 10 nm and is made of silver is laminated on the transflective electrode 26, a transparent auxiliary electrode 28 is laminated on the conductive transflective layer 27, and a sealing layer 29 is laminated on the transparent auxiliary electrode 28. Materials and thicknesses of the transparent auxiliary electrode 28 and sealing layer 29 are the same as those of the transparent auxiliary electrode 18 and sealing layer 19 in the light-emitting device 10.

Among spectra of light emitted from the light-emitting device 20, a spectrum of R light that is emitted from the light-emitting element 22R and is then emitted from the light-emitting device 20 is the same as that (spectrum of light emitted from the light-emitting device according to the first modified example) shown in FIG. 4. Thus, in the light-emitting device 20, a narrow band of an emission spectrum is realized and an increase in the amount of emitted light is achieved in the case of the 'R' light.

Figures 15, 16:
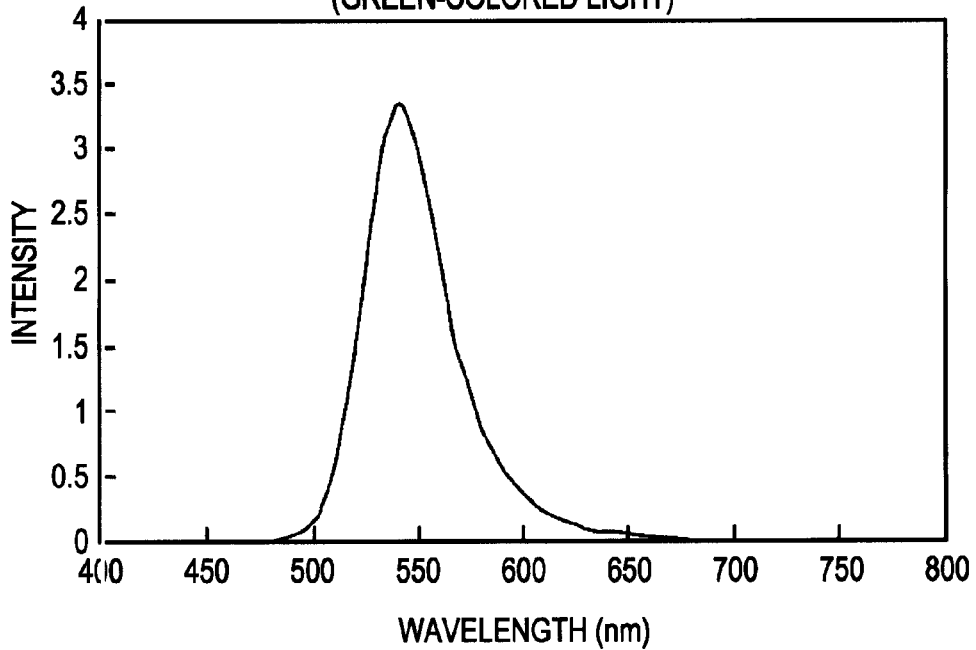
FIG. 15 is a view illustrating the spectrum of 'G' light that is emitted from a light-emitting element of the light-emitting device and is then emitted from the light-emitting device.
FIG. 16 is a view illustrating the characteristics of the emitted light in FIG. 15.

FIG. 15 is a view illustrating the spectrum of 'G' light that is emitted from the light-emitting element 22G and is then emitted from the light-emitting device 20. FIG. 16 is a view illustrating the characteristics of the emitted light in FIG. 15. As shown in the drawing, the half-value width of a spectrum of 'G' light is 44.6 nm. The half-value width is equal to or smaller than that of a spectrum of 'G' light in a known device. Furthermore, a total luminous flux output efficiency, which is the ratio of emitted light beams to all light beams outgoing from the light-emitting element 22G, is 0.231. This efficiency is higher than a total luminous flux output efficiency of 'G' light in the known device. That is, in the light-emitting device 20, a narrow band of an emission spectrum is realized and an increase in the amount of emitted light is achieved even in the case of the 'G' light. Moreover, in the light-emitting device 20, it can be seen from FIG. 16 that a narrow band of an emission spectrum narrow is realized and an increase in the amount of emitted light is achieved even in the case of forward-emitted light ('G' light).

Figures 17, 18:
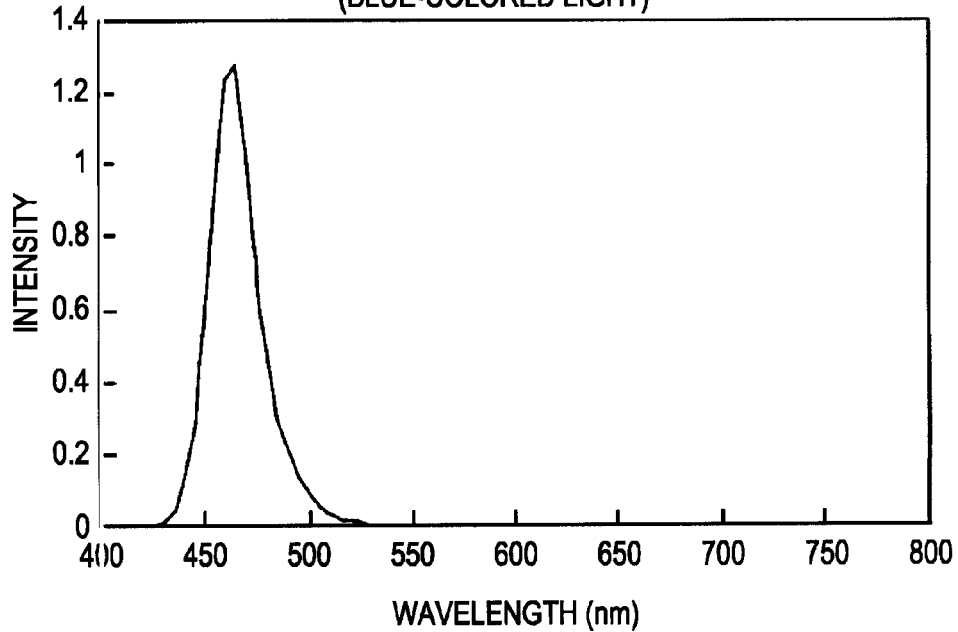
FIG. 17 is a view illustrating the spectrum of 'B' light that is emitted from a light-emitting element and is then emitted from the light-emitting device.
FIG. 18 is a view illustrating the characteristics of the emitted light in FIG. 17.

FIG. 17 is a view illustrating the spectrum of 'B' light that is emitted from the light-emitting element 22B and is then emitted from the light-emitting device 20. FIG. 18 is a view illustrating the characteristics of the emitted light in FIG. 17. As shown in the drawing, the half-value width of a spectrum of 'B' light is 25.3 nm. The half-value width is equal to or smaller than that of a spectrum of 'B' light in the known device. Furthermore, a total luminous flux output efficiency, which is the ratio of emitted light beams to all light beams outgoing from the light-emitting element 22B, is 0.095. This efficiency is higher than a total luminous flux output efficiency of 'B' light in the known device. That is, in the light-emitting device 20, a narrow band of an emission spectrum is realized and an increase in the amount of emitted light is achieved in the case of the 'B' light. Moreover, in the light-emitting device 20, it can be seen from FIG. 18 that a narrow band of an emission spectrum is realized and an increase in the amount of emitted light is achieved even in the case of forward-emitted light ('B' light).

As described above, in the light-emitting device 20, it can be said that making a band of an emission spectrum narrow and increase of the amount of emitted light are realized for all light beams of 'R', 'G', and 'B' light beams. In addition, the light-emitting device 20 may also be modified in the same manner as modifications in the light-emitting device 10.

Figures 19, 20:
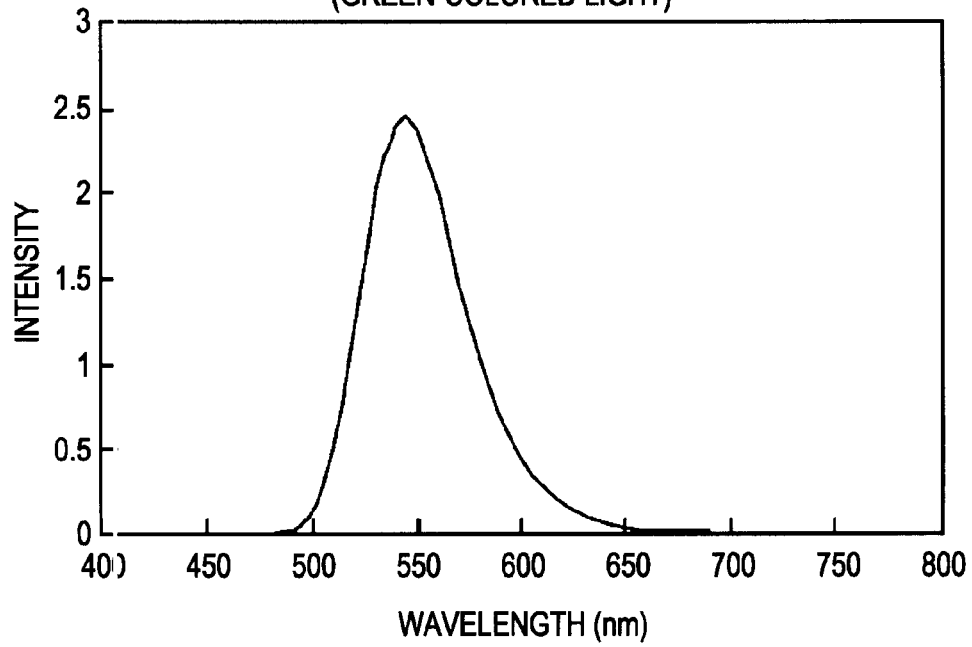
FIG. 19 is a view illustrating the spectrum of emitted light ('G' light) from a light-emitting device in a known example (second known example) to be compared with the light-emitting device.
FIG. 20 is a view illustrating the characteristics of the emitted light in FIG. 19.
Figures 21, 22:
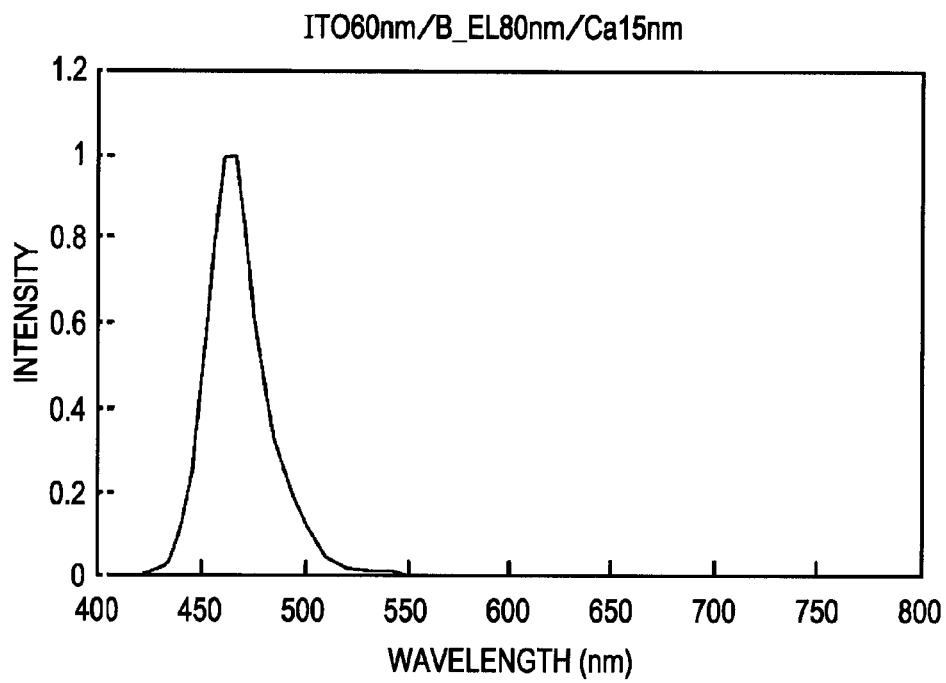
FIG. 21 is a view illustrating the spectrum of emitted light ('B' light) from the light-emitting device in the known example (second known example) to be compared with the light-emitting device.
FIG. 22 is a view illustrating the characteristics of the emitted light in FIG. 21.

FIGS. 19 and 21 are views illustrating spectra of emitted light from a light-emitting device in a known example (second known example) to be compared with the light-emitting device 20. FIG. 19 is a view related to 'G' light and is based on data shown in FIG. 20. FIG. 21 is a view related to 'B' light and is based on data shown in FIG. 22.

In the second known example, the transflective electrode 26 in the light-emitting device 20 is made thick so that the conductive transflective layer 17 is not needed. Specifically, in the light-emitting device in the second known example, the transflective electrode 26 is formed of calcium and the thickness of the transflective electrode 26 is 15 nm. In the light-emitting device, as for the 'G' light, the half-value width of a spectrum of emitted light is 56.2 nm, a total luminous flux output efficiency is 0.228, the half-value width of a spectrum of forward-emitted light is 54.2 nm, and a forward-direction light intensity output efficiency is 0.02354. Further, as for the 'B' light, the half-value width of a spectrum of emitted light is 28.7 nm, a total luminous flux output efficiency is 0.092, the half-value width of a spectrum of forward-emitted light is 27.0 nm, and a forward-direction light intensity output efficiency is 0.01057.

When comparing these values with those in the light-emitting device 20, it can be seen that the light-emitting device 20 is better than the light-emitting device in the second known example in terms of both making a band of the emission spectrum narrow and increasing the amount of emitted light. Accordingly, from the point of view of making the band of the emission spectrum narrow and increasing the amount of emitted light, it can be said that a configuration, in which the conductive transflective layer 27 having a high optical reflectance and a low coefficient of extinction is laminated on the thin transflective electrode 26, is better than a configuration having only the thick transflective electrode 26. Such tendency indicates that making the band of the emission spectrum narrow and increasing the amount of emitted light does not depend on the dominant emission wavelength of a light-emitting device.

Other Modifications

In the various kinds of light-emitting devices described above, organic EL elements, that is, OLED elements have been used as the light-emitting elements. However, the invention is not limited to the OLED elements but other suitable light-emitting elements may be used. An inorganic EL element may be mentioned as an example of other suitable light-emitting elements. In addition, even though details of structures of the exemplified light-emitting devices have been specifically described to make the invention easily understood, the invention is not limited thereto but other structures may be applied.

Applications

The various kinds of light-emitting devices described above may be applied to various electronic apparatuses. For example, the light-emitting device 10 and various kinds of light-emitting devices according to the modified examples may be used as a linear exposure device, which illuminates light on a photosensitive surface of an image carrier in an image forming apparatus, or a display device that displays an image by receiving image data used to display the image and causing each light-emitting element to emit light in brightness corresponding to the image data. When the light-emitting device 10 and various kinds of light-emitting devices according to the modified examples are used as the exposure device, the light-emitting elements 12 are arranged in the direction crossing the movement direction of photosensitive surfaces of image carriers. When the light-emitting device 10 and various kinds of light-emitting devices according to the modified examples are used as the display device, the light-emitting elements 12 are arranged in a matrix. Furthermore, the light-emitting device 20 and various kinds of light-emitting devices according to the modified examples may be used as a display device, for example.

Third Embodiment

Figure 23:
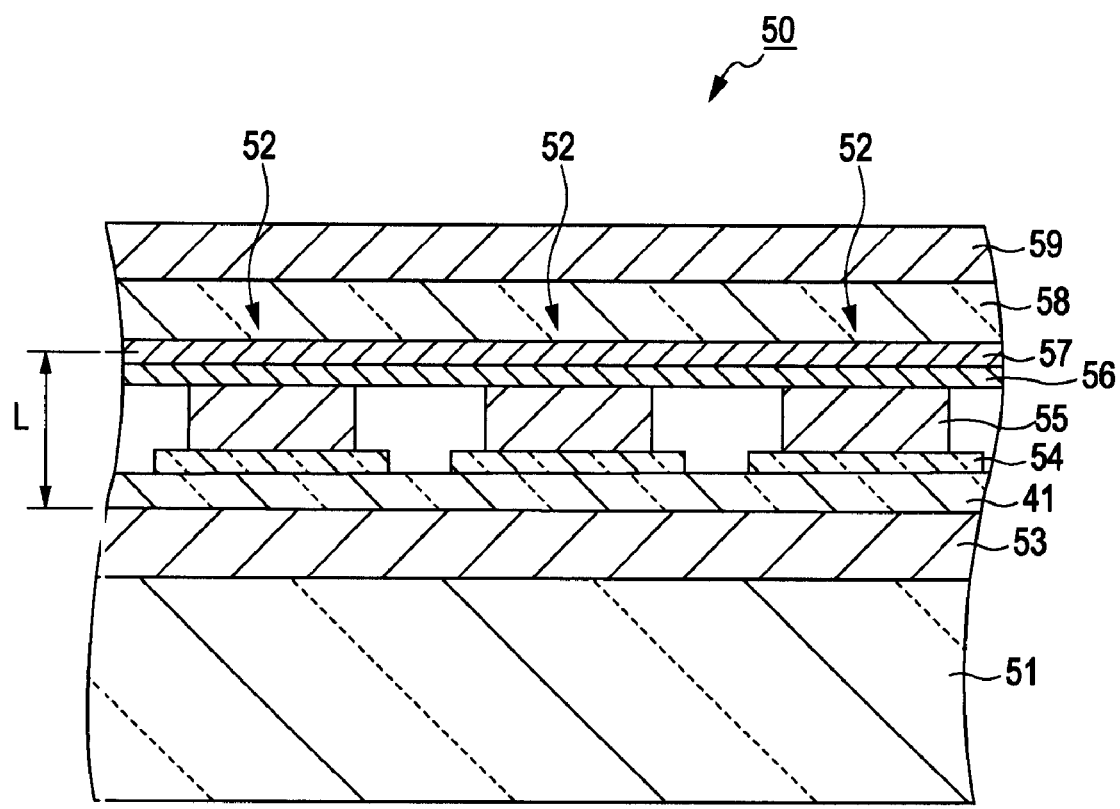
FIG. 23 is a cross-sectional view illustrating a part of a light-emitting device according to a third embodiment of the invention.

FIG. 23 is a cross-sectional view illustrating a part of a light-emitting device 50 according to a third embodiment of the invention. The third embodiment is different from the first embodiment in that a transparent layer is provided between the light reflection layer 13 and the transparent electrodes 14. The light-emitting device 50 has a plurality of light-emitting elements 52 arranged on a substrate 51. In FIG. 23, only three light-emitting elements 52 are shown. Each of the light-emitting elements 52 is an organic EL element, that is, an OLED (organic light-emitting diode) element. That is, the light-emitting device 50 is an organic EL device.

The substrate 51 is formed of a glass, for example, and the thickness of the substrate 51 is 500 μm, for example. On the substrate 51, a light reflection layer 53 from which light is totally reflected is formed. The light reflection layer 53 allows light to resonate and is formed of a material having a high optical reflectance. In addition, an upper surface of the light reflection layer 53 is smooth and the thickness of the light reflection layer 53 is 200 nm, for example. Specifically, a material used to form the light reflection layer 53 is silver. However, the present embodiment may be modified such that aluminum is used or an alloy containing one or both of silver and aluminum is used.

A transparent layer 41 is formed on the light reflection layer 53, and the plurality of light-emitting elements 52 are formed on the transparent layer 41. Each of the light-emitting elements 52 has a transparent electrode (first electrode) 54 formed on the light reflection layer 53, a light-emitting layer 55 that is formed on the transparent electrode 54 and has a thickness of 170 nm, and a transflective electrode (second electrode) 56 formed on the light-emitting layer 55. The transparent electrode 54 is an electrode that allows incident light to be transmitted therethrough. In addition, the transparent electrode 54 is formed of ITO (indium tin oxide) having a refractive index of 1.7, and the thickness of the transparent electrode 54 is equal to or larger than a minimum thickness (minimum thickness with which conductivity is obtained), which allows the transparent electrode 54 to sufficiently serve as an electrode, and less than 60 nm. Since a coefficient of extinction of ITO is large, it is necessary to make the transparent electrode 54 as thin as possible in order to reduce the loss of light at the time of resonance to be described later. For this reason, in the present embodiment, the thickness of the transparent electrode 54 is set to 30 nm.

The transparent layer 41 is formed of a material having a coefficient of extinction smaller than ITO, and the thickness thereof is 135 nm. Specifically, a material to form the transparent layer 41 is silicon dioxide having a refractive index of 1.49. However, the present embodiment may be modified such that silicon nitride having a refractive index of 1.87 is used to form the transparent layer 41. In this case, the thickness of the transparent layer 41 is set to 105 nm.

The light-emitting layer 55 is formed by laminating a light-emitting layer, which emits light through excitation of exciton formed by recombination of holes and electrons, on a hole injection layer through which holes are injected into the light-emitting layer. As is apparent from the above, in the present embodiment, each transparent electrode 54 serves as an anode and the transflective electrode 56 serves as a cathode. However, the present embodiment may be modified such that the transparent electrode 54 serves as a cathode and the transflective electrode 56 serves as an anode. The thickness of the hole injection layer is 50 nm and the refractive index of a material used to form the hole injection layer is 1.45, for example. The thickness of the light-emitting layer on the hole injection layer is 120 nm and the refractive index of a material used to form the light-emitting layer is 1.67, for example. In addition, a partition wall for partitioning the light-emitting layer 55 in each light-emitting element 52 may be formed or not formed. Moreover, the present embodiment may be modified such that the light-emitting layer 55 does not include the hole injection layer or the light-emitting layer 55 includes a hole transport layer, an electron injection layer, or an electron transport layer.

The transflective electrode 56 is an electrode that is common to all of the light-emitting layers 55 and has a thickness of 5 nm. The transflective electrode 56 covers all of the light-emitting layers 55. In addition, the transflective electrode 56 serves as a half mirror that allows light to resonate. That is, the transflective electrode 56 causes a part of light from the light-emitting layer 55 to be transmitted therethrough and the rest of the light to be reflected therefrom. Furthermore, the transflective electrode 56 is formed of a metal that allows electrons to be injected thereinto, and a work function of the transflective electrode 56 is 4 eV (electron volts) or less. Specifically, a material used to form the transflective electrode 56 is calcium. However, the present embodiment may be modified such that lithium, strontium, barium, cesium, ytterbium, or samarium is also used to form the transflective electrode 56.

Furthermore, a conductive transflective layer 57 that is translucent is formed on the transflective electrode 56. The conductive transflective layer 57 causes a part of light from the transflective electrode 56 to be transmitted therethrough and the rest of the light to be reflected therefrom and covers the transflective electrode 56. Accordingly, the conductive transflective layer 57 is formed of a metal having a higher optical reflectance than the transflective electrode 56 and a lower coefficient of extinction than the transflective electrode 56, and the thickness of the conductive transflective layer 57 is 8 nm. Specifically, a material used to form the conductive transflective layer 57 is silver. However, the present embodiment may be modified such that the conductive transflective layer 57 is formed of magnesium, platinum, or aluminum.

A transparent auxiliary electrode 58 is formed on the conductive transflective layer 57. The transparent auxiliary electrode 58 is a transparent electrode that assists the conductivity of the transflective electrode 56 and covers the conductive transflective layer 57. The transparent auxiliary electrode 58 is formed of ITO. However, the present embodiment may be modified such that the transparent auxiliary electrode 18 is formed of indium zinc oxide or indium gallium oxide. The thickness of the transparent auxiliary electrode 58 is 100 nm. However, the thickness of the transparent auxiliary electrode 58 may be arbitrarily set within a range in which sufficient conductivity is realized. Moreover, in a portion not overlapping the light-emitting elements 52, a metal auxiliary electrode may be provided on the transparent auxiliary electrode 58 or instead of the transparent auxiliary electrode 58. The metal auxiliary electrode is a metal electrode that assists the conductivity of the transflective electrode 56 and is formed of a metal that is opaque and has a high conductivity.

A sealing layer 59 is formed on the transparent auxiliary electrode 58. The sealing layer 59 serves to protect all of the light-emitting elements 52 against the air and is formed of a transparent inorganic material. Therefore, outgoing light resulting from emission in the light-emitting layer 55 is emitted through the transflective electrode 56, the conductive transflective layer 57, the transparent auxiliary electrode 58, and the sealing layer 59. On the other hand, since the light reflection layer 53 exists, the outgoing light is not emitted from the substrate 51. That is, the light-emitting device 50 is a top-emission-type light-emitting device in which light from the light-emitting elements 52 is emitted toward a side opposite to the substrate 51. In addition, a film sealing method in which the sealing layer 59 is formed by film formation is adopted in the present embodiment. However, the present embodiment may be modified such that other known sealing methods are used.

Each of the light-emitting elements 52, the light reflection layer 53, the transparent layer 41, and the conductive transflective layer 57 form a resonance structure, that is, a microcavity. In this case, a resonance distance L, which is a distance between the light reflection layer 53 and the conductive transflective layer 57, and thickness and refractive index of each layer within a microcavity are set to approximately satisfy a resonance condition that is a condition in which light having a wavelength of λ moves back and forth between the light reflection layer 53 and the conductive transflective layer 57 and the light having a wavelength of λ is amplified to be then emitted from the light-emitting device 50.

Specifically, in each microcavity, the resonance distance L is set to satisfy d=¾λ assuming that an optical path length between the light reflection layer 53 and the conductive transflective layer 57 is 'd'. λ is a dominant emission wavelength of light emitted from the light-emitting layer 55. Specifically, λ is 630 nm. Therefore, 'L' is set such that 'd' is approximately equal to ¾·630=472.5 nm. In addition, the above conditional expression (d=¾·λ) is applied to a case of three-dimensional light. However, in the case in which light having different dimensions is applied in a modification of the present invention, a conditional expression different from the above expression is used.

Figures 24, 25:
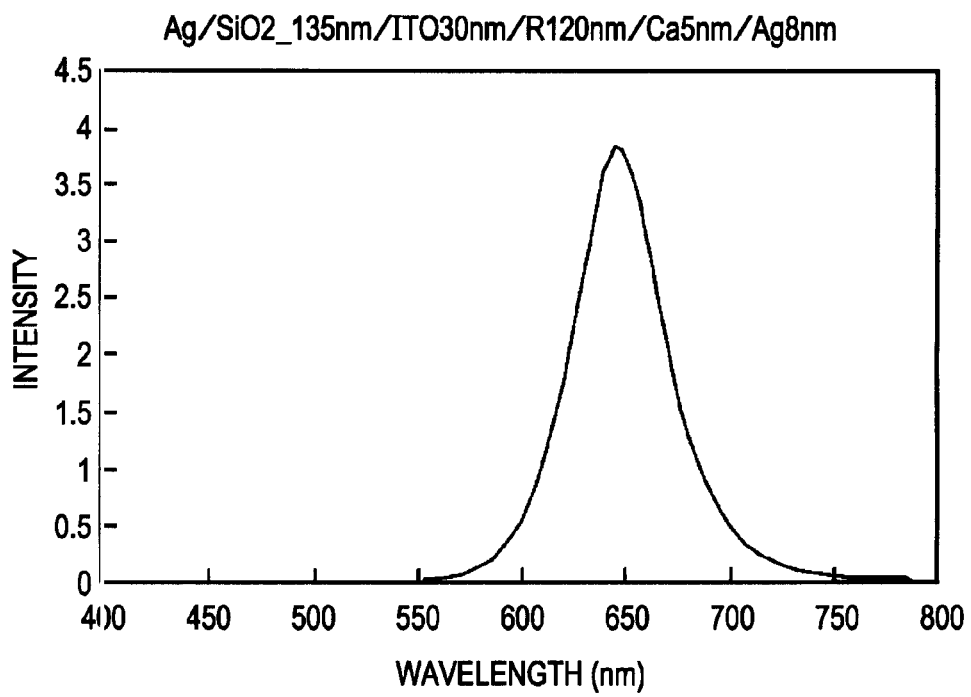
FIG. 24 is a view illustrating the spectrum of light (emitted light) that is emitted from light-emitting elements of the light-emitting device and is then emitted from the light-emitting device.
FIG. 25 is a view illustrating the characteristics of the emitted light in FIG. 24.

FIG. 24 is a view illustrating the spectrum of light (emitted light) that is emitted from the light-emitting elements 52 and is then emitted from the light-emitting device 50. FIG. 25 is a view illustrating the characteristics of the emitted light in FIG. 24. As shown in the drawings, the half-value width of the spectrum of emitted light is set to 49.6 nm. The half-value width is equal to or smaller than a half-value width of a spectrum of emitted light in a known top-emission-type light-emitting device (known device). That is, in the light-emitting device 50, a narrow band of an emission spectrum is realized.

Furthermore, a total luminous flux output efficiency, which is the ratio of emitted light beams to all light beams outgoing from the light-emitting elements 52, is 0.299. This efficiency is higher than that in a known device. That is, in the light-emitting device 50, the amount of emitted light increases. Moreover, CIE1931x which is the 'x' value of chromaticity of emitted light based on CIE1931 is 0.688, and CIE1931y which is the 'y', value of the chromaticity of the emitted light based on CIE1931 is 0.311.

Moreover, in the case of light (forward-emitted light), which propagates in the direction (forward direction) within a range in which an angle between the light and an imaginary line normal to a light-emitting surface is ±15°, of the emitted light, the half-value width thereof is 48.3 nm. In addition, a forward-direction light intensity output efficiency, which is the ratio of the light intensity of the forward-emitted light to the light intensity of all light beams outgoing from the light-emitting elements 52, is 0.03143. That is, in the light-emitting device 50, a narrow band of an emission spectrum is realized and an increase in the amount of emitted light is achieved even in the case of the forward-emitted light.

In addition, a true border color difference, which is a color difference of emitted light (forward-border-emitted light) propagating within a range of ±15° described above with respect to emitted light (straight-forward-emitted light) propagating in the straight forward direction, is 0.005. This is a sufficiently small value and indicates that the chromaticity of emitted light negligibly depends on the viewing direction. In addition, the true border color difference is a positive square root of a sum of the square of a difference between CIE1931x of the straight-forward-emitted light and CIE1931x of the forward-border-emitted light and the square of a difference between CIE1931y of the straight-forward-emitted light and CIE1931y of the forward-border-emitted light.

Figures 26, 27:
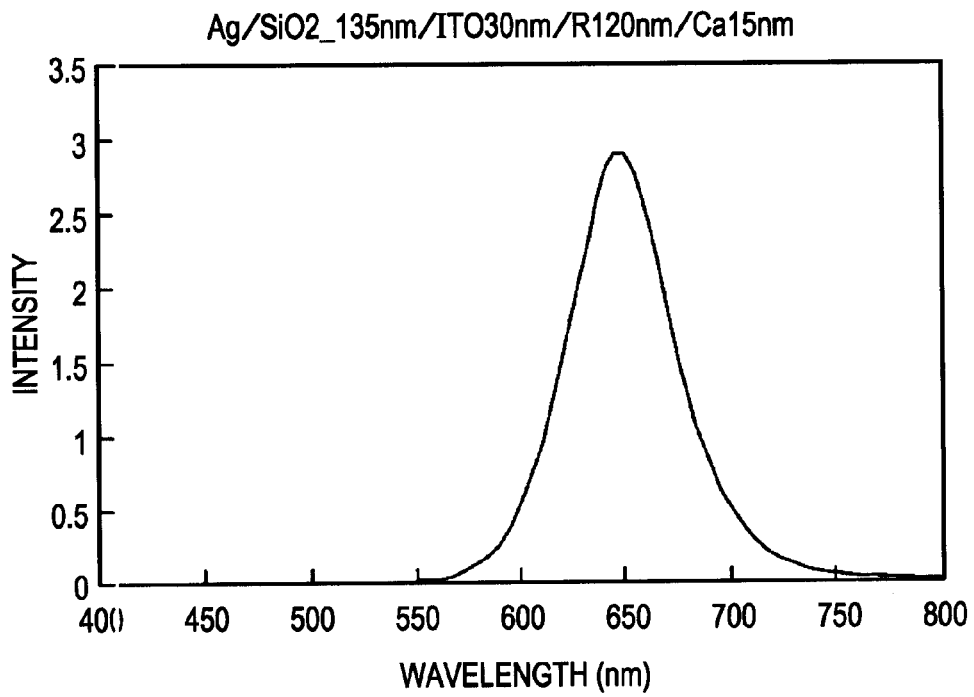
FIG. 26 is a view illustrating the spectrum of emitted light from a light-emitting device according to another modified example (fourth modified example) of the light-emitting device.
FIG. 27 is a view illustrating the characteristics of the emitted light in FIG. 26.

FIG. 26 is a view illustrating the spectrum of emitted light from a light-emitting device according to another modified example (fourth modified example) of the light-emitting device 50. FIG. 27 is a view illustrating the characteristics of the emitted light in FIG. 26. In the light-emitting device, the conductive transflective layer 57 is not provided and the thickness of the transflective electrode 56 is 15 nm. In the light-emitting device, the half-value width of a spectrum of emitted light is 57.4 nm and the total luminous flux output efficiency is 0.272. In addition, as for the forward-emitted light, the half-value width thereof is 55.4 nm and the forward-direction light intensity output efficiency is 0.02709. That is, in the light-emitting device, a narrow band of an emission spectrum is realized and an increase in the amount of emitted light is achieved.

As is apparent from comparison of the half-value widths, total luminous flux output efficiencies, and forward-direction light intensity output efficiencies between the light-emitting device 50 and the light-emitting device according to the fourth modified example, a case of making the transflective electrode 56 thin so that the conductive transflective layer 57 is essentially provided is more preferable than a case of making the transflective electrode 56 thick so that the conductive transflective layer 57 is not needed from the point of view of making a band of the emission spectrum narrow and increasing the amount of emitted light.

Figures 28, 29:
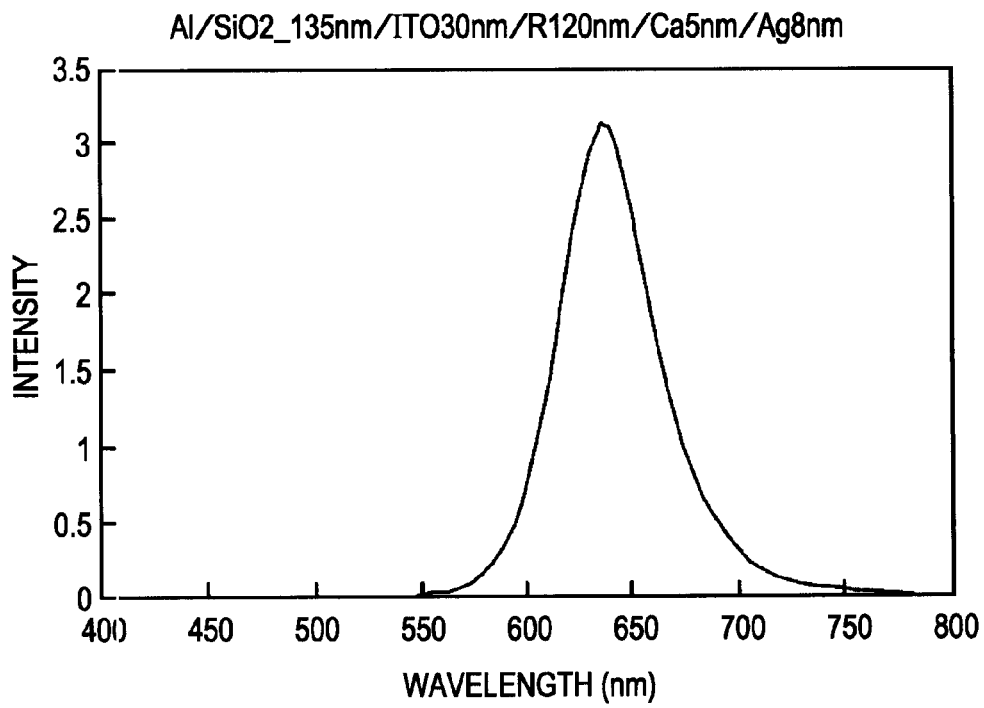
FIG. 28 is a view illustrating the spectrum of emitted light from a light-emitting device according to still another modified example (fifth modified example) of the light-emitting device.
FIG. 29 is a view illustrating the characteristics of the emitted light in FIG. 28.

FIG. 28 is a view illustrating the spectrum of emitted light from a light-emitting device according to still another modified example (fifth modified example) of the light-emitting device 50. FIG. 29 is a view illustrating the characteristics of the emitted light in FIG. 28. The light reflection layer 53 of the light-emitting device is formed of aluminum. In the light-emitting device, the half-value width of a spectrum of emitted light is 51.3 nm and the total luminous flux output efficiency is 0.224. In addition, as for forward-emitted light, the half-value width thereof is 49.6 nm and the forward-direction light intensity output efficiency is 0.02593. That is, in the light-emitting device, a narrow band of an emission spectrum is realized and an increase in the amount of emitted light is achieved.

As is apparent from comparison of the half-value widths, total luminous flux output efficiencies, and forward-direction light intensity output efficiencies between the light-emitting device 50 and the light-emitting device according to the fifth modified example, silver is more suitable than aluminum as a material used to form the light reflection layer 53 from the point of view of making a band of the emission spectrum narrow and increasing the amount of emitted light. On the other hand, from the point of view of manufacturing a light-emitting device more easily, aluminum is more suitable than silver.

Figures 30, 31:
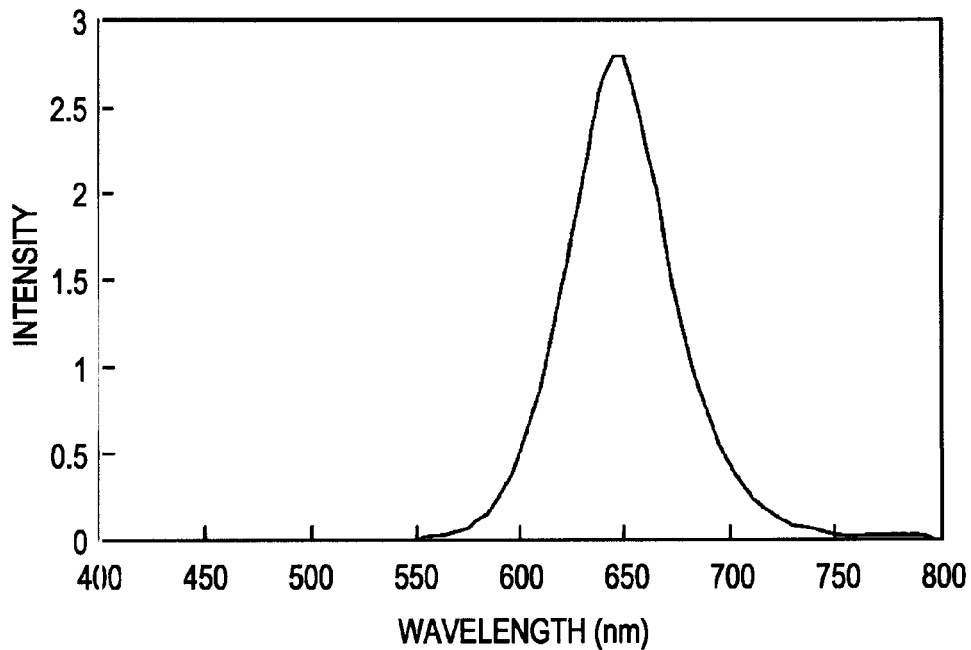
FIG. 30 is a view illustrating the spectrum of emitted light from a light-emitting device according to still another modified example (sixth modified example) of the light-emitting device.
FIG. 31 is a view illustrating the characteristics of the emitted light in FIG. 30.

FIG. 30 is a view illustrating the spectrum of emitted light from a light-emitting device according to still another modified example (sixth modified example) of the light-emitting device 50. FIG. 31 is a view illustrating the characteristics of the emitted light in FIG. 30. In this light-emitting device, the light reflection layer 53 is formed of aluminum and the transparent layer 41 is formed of silicon nitride. The thickness of the transparent layer 41 is 105 nm. In the light-emitting device, the half-value width of a spectrum of emitted light is 55.2 nm and the total luminous flux output efficiency is 0.281. In addition, as for the forward-emitted light, the half-value width thereof is 53.8 nm and the forward-direction light intensity output efficiency is 0.02516. That is, in the light-emitting device, a narrow band of an emission spectrum is realized and an increase in the amount of emitted light is achieved.

As is apparent from comparison of the half-value width in the fifth modified example and that in the sixth modified example, silicon dioxide is more suitable than silicon nitride as a material to use the transparent layer 41 from the point of view of making a band of the emission spectrum narrow. In addition, silicon nitride is suitable from the point of view of the total luminous flux output efficiency, and silicon dioxide is suitable from the point of view of the forward-direction light intensity output efficiency.

Figures 32, 33:
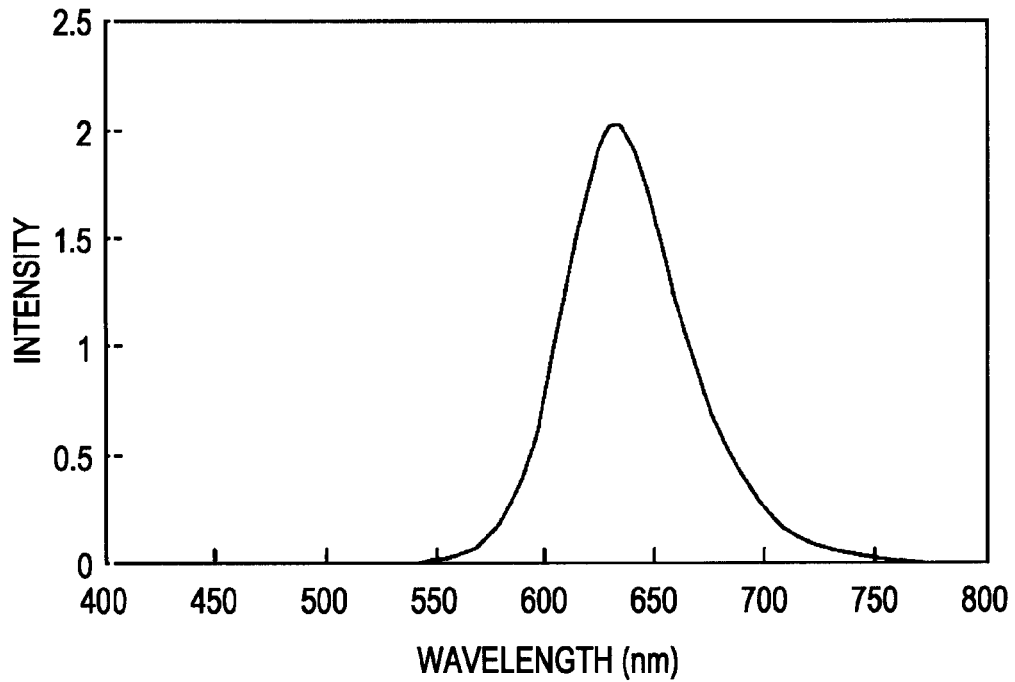
FIG. 32 is a view illustrating the spectrum of emitted light from a light-emitting device in a known example (third known example) to be compared with the light-emitting device or the light-emitting devices according to the various modified examples.
FIG. 33 is a view illustrating the characteristics of the emitted light in FIG. 32.

FIG. 32 is a view illustrating the spectrum of emitted light from a light-emitting device in a known example (third known example) to be compared with the light-emitting device 50 or the light-emitting devices according to the various modified examples. FIG. 33 is a view illustrating the characteristics of the emitted light in FIG. 32. In the third known example, the light reflection layer 53 is formed of aluminum and the transparent electrode 54 is made thick so that the conductive transflective layer 54 is not needed in the light-emitting device according to the fourth modified example. The thickness of the transparent electrode 54 is 125 nm.

In the light-emitting device according to the third known example, the half-value width of a spectrum of emitted light is 60.6 nm and the total luminous flux output efficiency is 0.202. In addition, as for the forward-emitted light, the half-value width thereof is 59.0 nm and the forward-direction light intensity output efficiency is 0.01923. When comparing these values with those in the light-emitting device 50 and the light-emitting devices according to the modified examples, it can be seen that the light-emitting device 50 and the light-emitting devices according to the modified examples are better than the light-emitting device in the known example in terms of both making a band of the emission spectrum narrow and increasing the amount of emitted light. Accordingly, from the point of view of making the band of the emission spectrum narrow and increasing the amount of emitted light, it can be said that a configuration, in which the transparent layer 41 having a low coefficient of extinction is essentially provided by making the transparent electrode 54 thin, is better than a configuration in which the transparent electrode 54 is made thick so that the transparent layer 41 is not needed.

Moreover, from the point of view of making a band of a spectrum of emitted light narrow, aluminum is more suitable than silver and magnesium is much more suitable than aluminum as a material used to form the conductive transflective layer 57. On the other hand, from the point of view of increasing the amount of emitted light, magnesium is more suitable than aluminum and silver is much more suitable than magnesium as a material used to form the conductive transflective layer 57. In addition, even in the case in which the light reflection layer 53 is formed of magnesium, the various kinds of effects described above are obtained.

Fourth Embodiment

Figure 34:
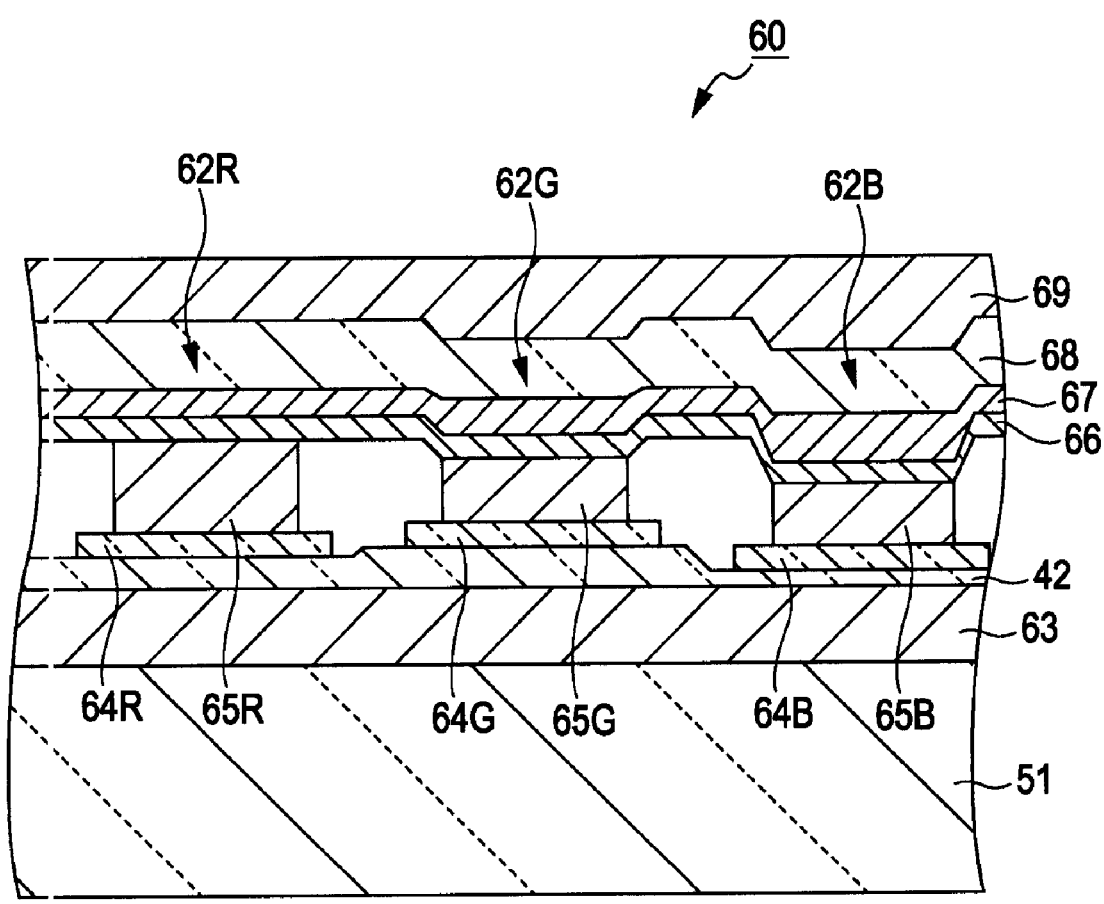
FIG. 34 is a cross-sectional view illustrating a part of a light-emitting device according to a fourth embodiment of the invention.

FIG. 34 is a cross-sectional view illustrating a part of a light-emitting device 60 according to a fourth embodiment of the invention. The fourth embodiment is different from the third embodiment in that a full color image can be displayed. The light-emitting device 60 is suitable for display of a full color image and has a plurality of pixels arranged in a matrix on a transparent layer 42. Each of the pixels includes a light-emitting element 62R that emits 'R' light corresponding to a color close to a red color, a light-emitting element 62G that emits 'G' light corresponding to a color close to a green color, and a light-emitting element 62B that emits 'B' light corresponding to a color close to a blue color. The configuration below the transparent layer 42 is the same as the configuration below the transparent layer 41 in the light-emitting device 50.

The transparent layer 42 is different from the transparent layer 41 of the light-emitting device 50 in that the thickness of the transparent layer 42 is not uniform. The thickness of the transparent layer 42 below the light-emitting element 62R is 130 nm, the thickness of the transparent layer 42 below the light-emitting element 62G is 135 nm, and the thickness of the transparent layer 42 below the light-emitting element 62B is 35 nm. Forming a layer having a non-uniform thicknesses is realized by separately performing a plural number of film formations using the same material, for example.

Each of the light-emitting elements 62R, 62G, and 62B has the same configuration as the light-emitting element 52 in the light-emitting device 50. For example, the light-emitting element 62R is configured to include a transparent electrode 64R, a transflective electrode 66, and a light-emitting layer 65R interposed between the transparent electrode 64R and the transflective electrode 66. Materials and thicknesses of the transparent electrode 64R, light-emitting layer 65R, and transflective electrode 66 are equal to those of the transparent electrode 54, light-emitting layer 55, and transflective electrode 56.

In this case, the dominant emission wavelength of light emitted from a light-emitting layer 65G of the light-emitting element 62G is 550 nm, and the dominant emission wavelength of light emitted from a light-emitting layer 65B of the light-emitting element 62B is 480 nm. In addition, the thickness of a light-emitting layer on a hole injection layer included in the light-emitting layer 65G and the light-emitting layer 65B is 80 nm. On the other hand, the thickness of each of the transparent electrodes 64G and 64B is 30 nm. As a result, as shown in FIG. 34, upper surfaces of the light-emitting layers 65R, 65G, and 65B are not at the same height, such that the transflective electrode 66 has unevenness.

The configuration above the light-emitting elements 62R, 62G, and 62B is the same as the configuration above the light-emitting elements 52 in the light-emitting device 50 except that there is unevenness along the transflective electrode 66. That is, a conductive transflective layer 67 that is made of silver is laminated on the transflective electrode 66, a transparent auxiliary electrode 68 is laminated on the conductive transflective layer 67, and a sealing layer 69 is laminated on the transparent auxiliary electrode 68. Materials and thicknesses of the transparent auxiliary electrode 68 and sealing layer 69 are the same as those of the transparent auxiliary electrode 58 and sealing layer 59 in the light-emitting device 50. The thickness of the conductive transflective layer 67 above the light-emitting element 62R is 8 nm, the thickness of the conductive transflective layer 67 above the light-emitting element 62G is 15 nm, and the thickness of the conductive transflective layer 67 above the light-emitting element 62B is 18 nm.

Among spectra of light emitted from the light-emitting device 60, a spectrum of R light that is emitted from the light-emitting element 62R and is then emitted from the light-emitting device 60 is the same as that (spectrum of light emitted from the light-emitting device 50) shown in FIG. 24. Thus, in the light-emitting device 60, a narrow band of an emission spectrum is realized and an increase in the amount of emitted light is achieved in the case of the 'R' light.

Figures 35, 36:
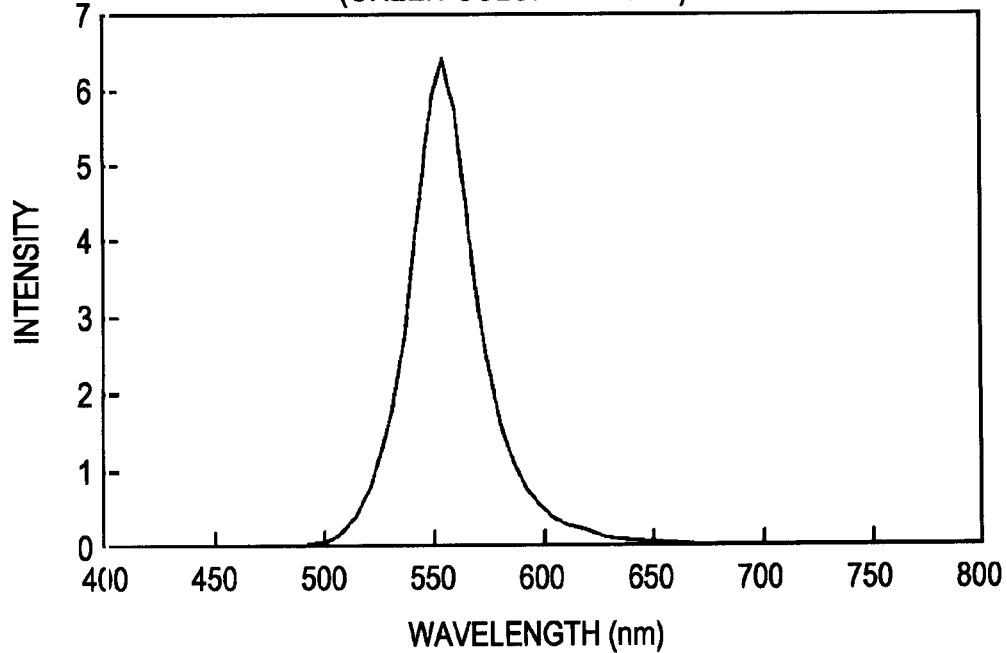
FIG. 35 is a view illustrating the spectrum of 'G' light that is emitted from a light-emitting element of the light-emitting device and is then emitted from the light-emitting device.
FIG. 36 is a view illustrating the characteristics of the emitted light in FIG. 35.

FIG. 35 is a view illustrating the spectrum of 'G' light that is emitted from the light-emitting element 62G and is then emitted from the light-emitting device 60. FIG. 36 is a view illustrating the characteristics of the emitted light in FIG. 35. As shown in the drawing, the half-value width of a spectrum of 'G' light is 30.9 nm. The half-value width is equal to or smaller than that of a spectrum of 'G' light in a known device. Furthermore, a total luminous flux output efficiency, which is the ratio of emitted light beams to all light beams outgoing from the light-emitting element 62G, is 0.311. This efficiency is higher than a total luminous flux output efficiency of 'G' light in the known device. That is, in the light-emitting device 60, a narrow band of an emission spectrum is realized and an increase in the amount of emitted light is achieved even in the case of the 'G' light. Moreover, in the light-emitting device 60, it can be seen from FIG. 36 that a narrow band of an emission spectrum is realized and an increase in the amount of emitted light is achieved even in the case of forward-emitted light ('G' light).

Figures 37, 38:
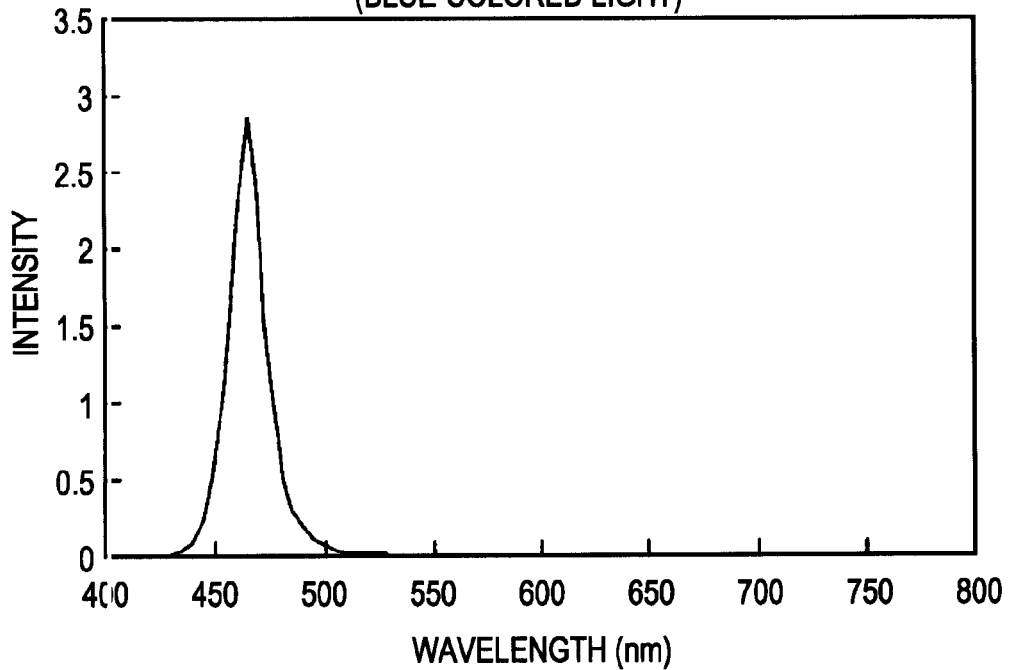
FIG. 37 is a view illustrating the spectrum of 'B' light that is emitted from a light-emitting element and is then emitted from the light-emitting device.
FIG. 38 is a view illustrating the characteristics of the emitted light in FIG. 37.

FIG. 37 is a view illustrating the spectrum of 'B' light that is emitted from the light-emitting element 62B and is then emitted from the light-emitting device 60. FIG. 38 is a view illustrating the characteristics of the emitted light in FIG. 37. As shown in the drawing, the half-value width of a spectrum of 'B' light is 17.8 nm. The half-value width is equal to or smaller than that of a spectrum of 'B' light in the known device. Furthermore, a total luminous flux output efficiency, which is the ratio of emitted light beams to all light beams outgoing from the light-emitting element 62B, is 0.123. This efficiency is higher than a total luminous flux output efficiency of 'B' light in the known device. That is, in the light-emitting device 60, a narrow band of an emission spectrum is realized and an increase in the amount of emitted light is achieved in the case of the 'B' light. Moreover, in the light-emitting device 60, it can be seen from FIG. 38 that a narrow band of an emission spectrum is realized and an increase in the amount of emitted light is achieved even in the case of forward-emitted light ('B' light).

As described above, in the light-emitting device 60, it can be said that making a band of an emission spectrum narrow and increase of the amount of emitted light are realized for all light beams of 'R', 'G', and 'B' light beams. In addition, the light-emitting device 60 may also be modified in the same manner as modifications in the light-emitting device 50.

Figures 39, 40:
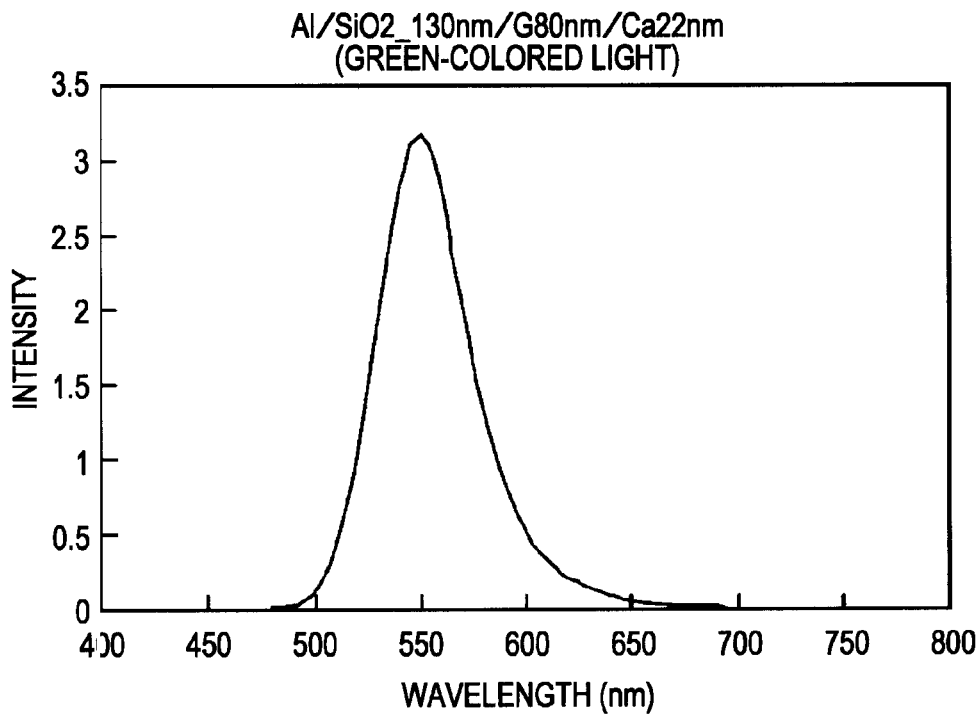
FIG. 39 is a view illustrating the spectrum of emitted light ('G' light) from a light-emitting device according to a modified example (seventh modified example) of the light-emitting device.
FIG. 40 is a view illustrating the characteristics of the emitted light in FIG. 39.

FIG. 39 is a view illustrating the spectrum of emitted light ('G' light) from a light-emitting device according to a modified example (seventh modified example) of the light-emitting device 60. FIG. 40 is a view illustrating the characteristics of the emitted light in FIG. 39. In the light-emitting device, the conductive transflective layer 67 is not provided and the thickness of the transflective electrode 66 is 22 nm. In the light-emitting device, the half-value width of a spectrum of 'G' light is 47.9 nm and the total luminous flux output efficiency is 0.296. In addition, as for forward-emitted light, the half-value width thereof is 47.4 nm and the forward-direction light intensity output efficiency is 0.03157. That is, in the light-emitting device, a narrow band of an emission spectrum is realized and an increase in the amount of emitted light is achieved. Accordingly, from the point of view of making the band of the emission spectrum narrow and increasing the amount of emitted light, it can be said that a case of making the transflective electrode 66 thin so that the conductive transflective layer 67 is essentially provided is more preferable than a case of making the transflective electrode 66 thick so that the conductive transflective layer 67 is not needed. Such tendency indicates that making the band of the emission spectrum narrow and increasing the amount of emitted light does not depend on the dominant emission wavelength of a light-emitting device.

Figures 41, 42:
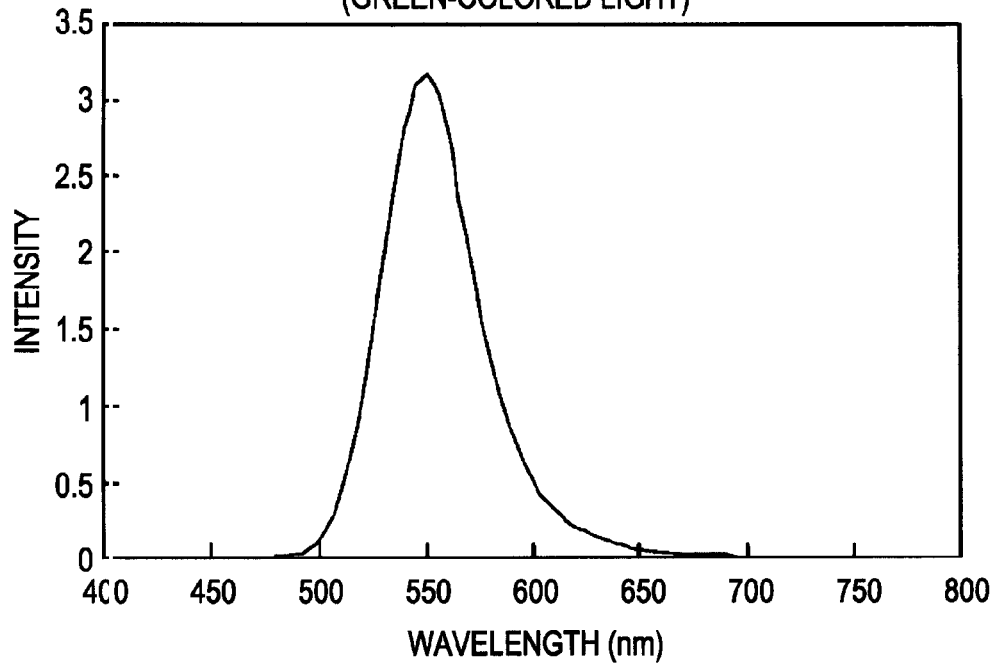
FIG. 41 is a view illustrating the spectrum of emitted light ('G' light) from a light-emitting device according to another modified example (eighth modified example) of the light-emitting device.
FIG. 42 is a view illustrating the characteristics of the emitted light in FIG. 41.
Figures 43, 44:
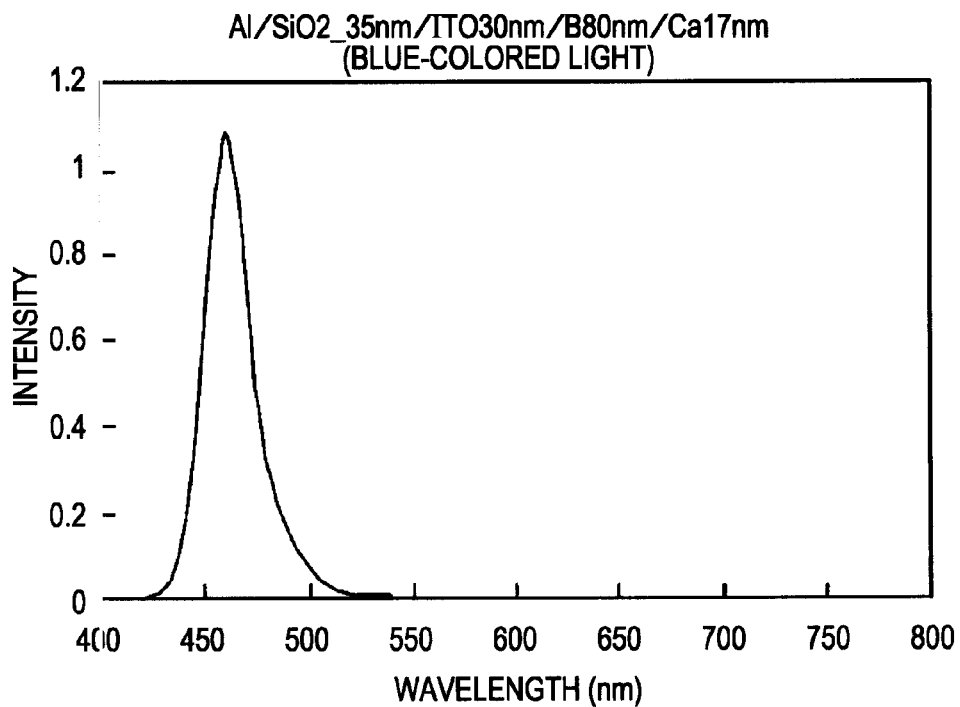
FIG. 43 is a view illustrating the spectrum of emitted light ('B' light) from the light-emitting device according to another modified example (eighth modified example) of the light-emitting device.
FIG. 44 is a view illustrating the characteristics of the emitted light in FIG. 43.

FIGS. 41 and 43 are views illustrating spectra of emitted light from a light-emitting device according to another modified example (eighth modified example) of the light-emitting device 60. The spectrum shown in FIG. 41 corresponds to 'G' light having characteristics shown in FIG. 42, and the spectrum shown in FIG. 43 corresponds to 'B' light having characteristics shown in FIG. 44. In the light-emitting device, a light reflection layer 63 is formed of aluminum. In addition, the thickness of the transflective electrode 66 above the light-emitting layer 65G is 22 nm and the thickness of the transflective electrode 66 above the light-emitting layer 65B is 17 nm. In addition, the conductive transflective layer 67 is not provided.

In the light-emitting device, as for 'G' light, the half-value width is 49.9 nm and the total luminous flux output efficiency is 0.225. In the case of forward-emitted light that is a part of the 'G' light, the half-value width is 47.6 nm and the forward-direction light intensity output efficiency is 0.02718. Further, as for 'B' light, the half-value width is 25.1 nm and the total luminous flux output efficiency is 0.065. In the case of forward-emitted light that is a part of the 'B' light, the half-value width is 24.6 nm and the forward-direction light intensity output efficiency is 0.00963. That is, in the light-emitting device, a narrow band of an emission spectrum is realized and an increase in the amount of emitted light is achieved even in the case of the 'G' and 'B' light beams.

Figures 45, 46:
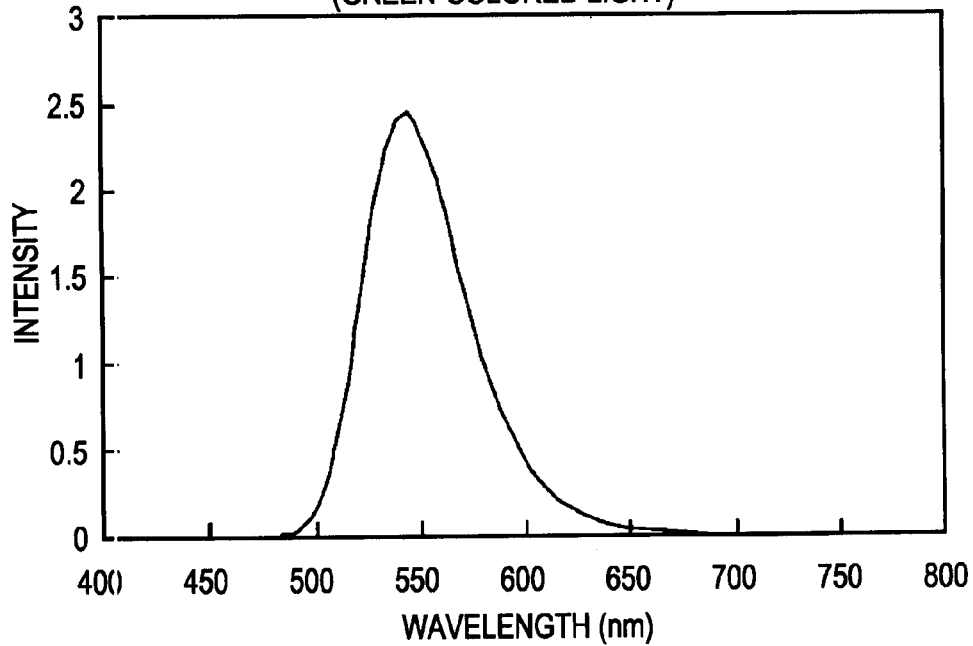
FIG. 45 is a view illustrating the spectrum of emitted light ('G' light) from a light-emitting device in a known example (fourth known example) to be compared with the light-emitting device.
FIG. 46 is a view illustrating the characteristics of the emitted light in FIG. 45.
Figures 47, 48:
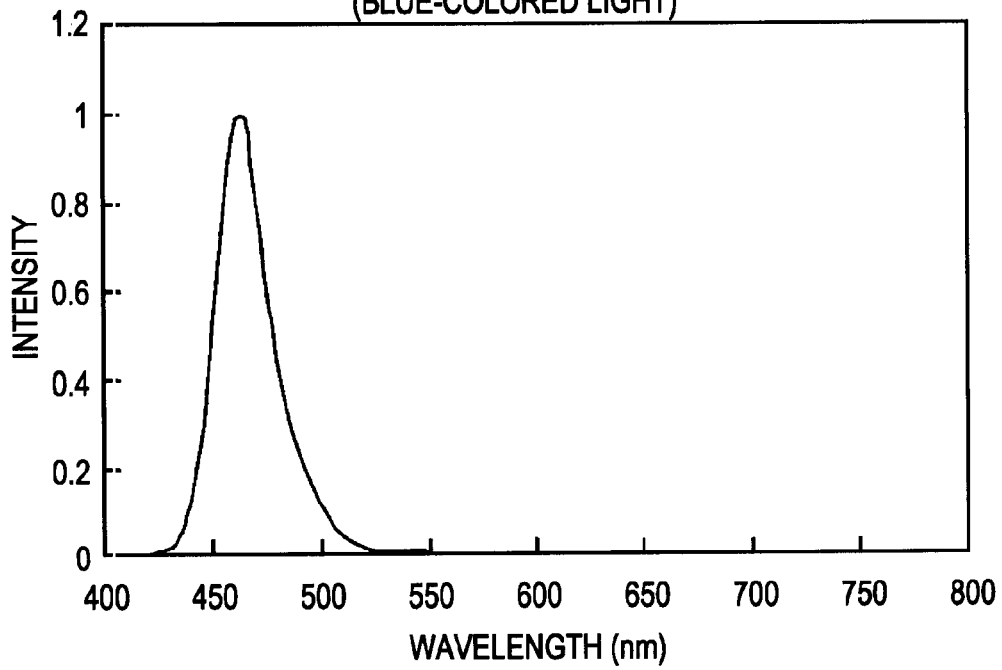
FIG. 47 is a view illustrating the spectrum of emitted light ('B' light) from the light-emitting device in the known example (fourth known example) to be compared with the light-emitting device.
FIG. 48 is a view illustrating the characteristics of the emitted light in FIG. 47.

FIGS. 45 and 47 are views illustrating spectra of emitted light from a light-emitting device in a known example (fourth known example) to be compared with the light-emitting device 60. The spectrum shown in FIG. 45 corresponds to 'G' light having characteristics shown in FIG. 46, and the spectrum shown in FIG. 47 corresponds to 'B' light having characteristics shown in FIG. 48. In the fourth known example, the transparent layer 42 is removed from the light-emitting device according to the eighth modified example. In addition, for a microcavity related to the light-emitting element 62G, the thickness of the transparent electrode 64G is appropriately set to satisfy a resonance condition, and for a microcavity related to the light-emitting element 62B, the thickness of the transparent electrode 64B is appropriately set to satisfy a resonance condition. In addition, the thickness of the transflective electrode 66 is set to 15 nm. The thickness of the transparent electrode 64G is 115 nm, and the thickness of the transparent electrode 64B is 60 nm.

In the light-emitting device, as for the 'G' light, the half-value width of a spectrum of emitted light is 56.2 nm, a total luminous flux output efficiency is 0.228, the half-value width of a spectrum of forward-emitted light is 54.2 nm, and a forward-direction light intensity output efficiency is 0.02354. Further, as for the 'B' light, the half-value width of a spectrum of emitted light is 28.7 nm, a total luminous flux output efficiency is 0.092, the half-value width of a spectrum of forward-emitted light is 27.0 nm, and a forward-direction light intensity output efficiency is 0.01057.

When comparing these values with those in the light-emitting device 60 and the light-emitting device according to the seventh modified example, it can be seen that the light-emitting device according to the seventh modified example are better than the light-emitting device in the known example in terms of both making a band of the emission spectrum narrow and increasing the amount of emitted light. Further, when comparing these values with those in the light-emitting device according to the eighth modified example, it can be seen that the light-emitting device according to the eighth modified example is better than the light-emitting device in the known example in terms of making a band of the emission spectrum narrow. Moreover, in the case of being limited to the forward direction of 'G' light, it can be seen that the light-emitting device according to the eighth modified example is excellent in terms of both making a band of the emission spectrum narrow and increasing the amount of emitted light.

Other Modifications

In the various kinds of light-emitting devices described above, organic EL elements, that is, OLED elements have been used as the light-emitting elements. However, the invention is not limited to the OLED elements but other suitable light-emitting elements may be used. An inorganic EL element may be mentioned as an example of other suitable light-emitting elements. In addition, even though details of structures of the exemplified light-emitting devices have been specifically described to make the invention easily understood, the invention is not limited thereto but other structures may be applied.

Applications

The various kinds of light-emitting devices described above may be applied to various electronic apparatuses. For example, the light-emitting device 50 and various kinds of light-emitting devices according to the modified examples may be used as a linear exposure device, which illuminates light on a photosensitive surface of an image carrier in an image forming apparatus, or a display device that displays an image by receiving image data used to display the image and causing each light-emitting element to emit light in brightness corresponding to the image data. When the light-emitting device 50 and various kinds of light-emitting devices according to the modified examples are used as the exposure device, the light-emitting elements 52 are arranged in the direction crossing the movement direction of photosensitive surfaces of image carriers. When the light-emitting device 50 and various kinds of light-emitting devices according to the modified examples are used as the display device, the light-emitting elements 52 are arranged in a matrix. Furthermore, the light-emitting device 60 and various kinds of light-emitting devices according to the modified examples may be used as a display device, for example.

Image Forming Apparatus

Figure 49:
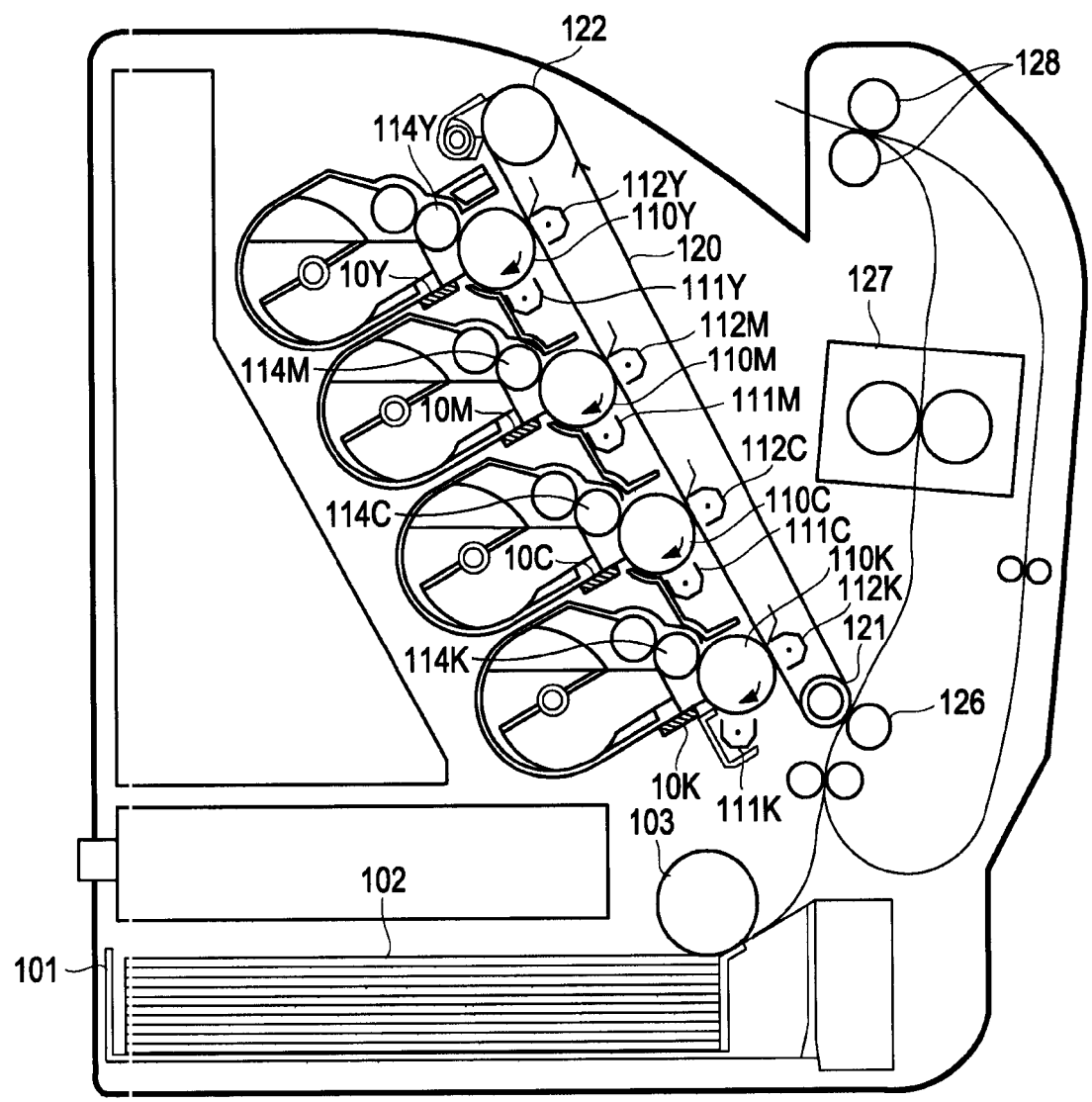
FIG. 49 is a longitudinal sectional view illustrating an example of an image forming apparatus that uses the light-emitting device according to the first embodiment or the light-emitting device according to the third embodiment as an exposure device.

FIG. 49 is a longitudinal sectional view illustrating an example of an image forming apparatus that uses the light-emitting device 10 as an exposure device. The image forming apparatus is a tandem-type full color image forming apparatus based on a belt intermediate transfer system.

In the image forming apparatus, four exposure devices 10K, 10C, 10M, and 10Y having the same configuration are arranged at exposure positions of four corresponding photoconductor drums (image carriers) 110K, 110C, 110M, and 110Y having the same configuration. Each of the exposure devices 10K, 10C, 10M, and 10Y is the light-emitting device 10 or the light-emitting device 50 described above.

As shown in FIG. 49, the image forming apparatus includes a driving roller 121 and a driven roller 122. In addition, an endless intermediate transfer belt 120 is stretched over the driving roller 121 and the driven roller 122 so as to rotate around the driving roller 121 and the driven roller 122 in the direction indicated by an arrow shown in FIG. 49. Although not shown, it may be possible to provide a tension applying unit, such as a tension roller, which applies a tension to the intermediate transfer belt 120.

The photoconductor drums 110K, 110C, 110M, and 110Y each having a photosensitive layer on its outer peripheral surface are arranged with a predetermined gap with respect to the intermediate transfer belt 120. The suffixes K, C, M, and Y indicate that the photoconductor drums having the suffixes are used to form developed images corresponding to black, cyan, magenta, and yellow, respectively. The same is true for other members. The photoconductor drums 110K, 110C, 110M, and 110Y are rotatably driven in synchronization with the driving of the intermediate transfer belt 120.

A corona charger 111 (K, C, M, and Y), the exposure device 10 (K, C, M, and Y), and a developing unit 114 (K, C, M, and Y) are disposed around each photoconductor drum 110 (K, C, M, and Y). The corona charger 111 (K, C, M, and Y) uniformly charges an outer peripheral surface of the corresponding photoconductor drum 110 (K, C, M, and Y). The exposure device 10 (K, C, M, and Y) writes an electrostatic latent image onto the outer peripheral surface, which is electrically charged, of the corresponding photoconductor drum. Each exposure device 10 (K, C, M, and Y) is arranged such that the arrayed direction of a plurality of EL elements is aligned with a generating line (in the main-scanning direction) of each photoconductor drum 110 (K, C, M, and Y). The writing of the electrostatic latent image is performed by causing the plurality of EL elements to illuminate light on the photoconductor drum. The developing unit 114 (K, C, M, and Y) applies toner, serving as a developer, onto an electrostatic latent image to thereby form a developed image, that is, a visible image on the photoconductor drum.

The developed images corresponding to black, cyan, magenta, and yellow, which are obtained through formation of four single-color images, are primary-transferred onto the intermediate transfer belt 120 in a sequential manner so as to overlap each other on the intermediate transfer belt 120. As a result, a full-color developed image is obtained. Four primary transfer corotrons (transferring units) 112 (K, C, M, and Y) are arranged on the inner side of the intermediate transfer belt 120. The primary transfer corotrons 112 (K, C, M, and Y) are arranged near the photoconductor drum 110 (K, C, M, and Y), respectively. The primary transfer corotrons 112 (K, C, M, and Y) transfer developed images onto the intermediate transfer belt 120, which passes between the photoconductor drums and the primary transfer corotrons, by electrostatically attracting the developed images from the photoconductor drum 110 (K, C, M, and Y).

A sheet 102, on which an image is to be finally formed, is fed from a paper feed cassette 101 one by one by a pickup roller 103. Then, the sheet 102 passes through a nip between the light-emitting device 20 in contact with the driving roller 121 and a secondary transfer roller 126. A full-color developed image on the intermediate transfer belt 120 is collectively secondary-transferred onto a single surface of the sheet 102 by means of the secondary transfer roller 126 and then passes through a fixing roller pair 127 serving as a fixation unit, such that the full-color image is fixed on the sheet 102. Thereafter, the sheet 102 is ejected onto a paper ejection cassette provided in an upper portion of the apparatus by means of a pair of paper ejection rollers 128.

Figure 50:
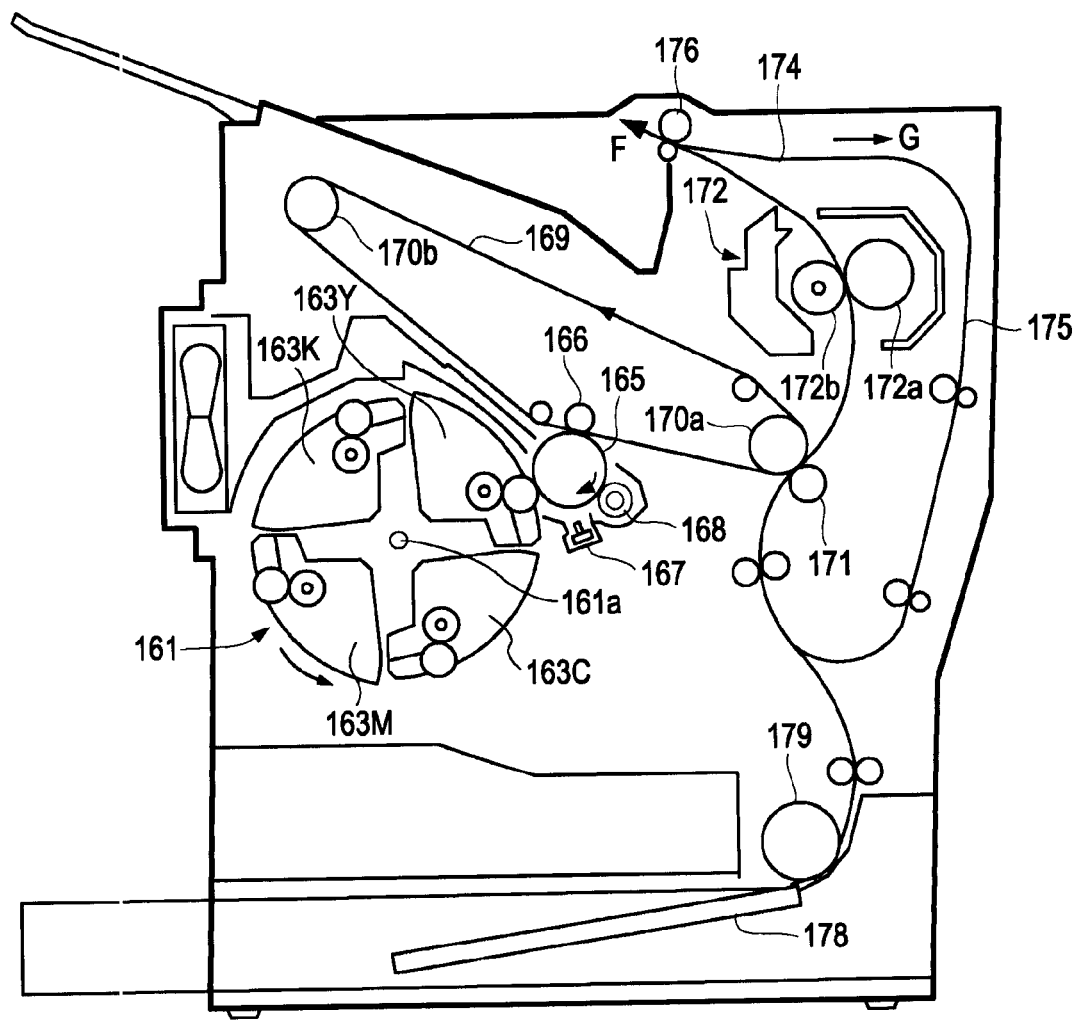
FIG. 50 is a longitudinal sectional view illustrating an example of another image forming apparatus that uses the light-emitting device according to the first embodiment or the light-emitting device according to the third embodiment as a linear exposure device.

FIG. 50 is a longitudinal sectional view illustrating an example of another image forming apparatus that uses the light-emitting device 10 or the light-emitting device 50 as a linear exposure device. The image forming apparatus is a rotary-development-type full color image forming apparatus based on a belt intermediate transfer system.

In the image forming apparatus shown in FIG. 50, a corona charger 168, a rotary developing unit 161, an exposure device 167, and an intermediate transfer belt 169 are provided in the periphery of a photoconductor drum (image carrier) 165.

The corona charger 168 uniformly charges an outer peripheral surface of the photoconductor drum 165. The exposure device writes an electrostatic latent image onto the outer peripheral surface, which is electrically charged, of the photoconductor drum 165. The exposure device 167 is the light-emitting device 10 or the light-emitting device 50 described above and is provided such that the arrayed direction of a plurality of EL elements is aligned with a generating line (in the main-scanning direction) of the photoconductor drum 165. The writing of the electrostatic latent image is performed by causing the plurality of EL elements to illuminate light on the photoconductor drum.

The developing unit 161 is a drum having four developing sections 163Y, 163C, 163M, and 163K arranged with an angle of 90° therebetween. The developing unit 161 can rotate around a shaft 161a counterclockwise. The developing sections 163Y, 163C, 163M, and 163K supply yellow, cyan, magenta, and black toner, respectively, onto the photoconductor drum 165 to apply toner, serving as a developer, onto the electrostatic latent image, thereby forming a developed image, that is, a visible image on the photoconductor drum 165.

The endless intermediate transfer belt 169 are stretched over a driving roller 170a, a driven roller 170b, a primary transfer roller 166, and a tension roller, such that the endless intermediate transfer belt 169 rotates around the driving roller 170a, the driven roller 170b, the primary transfer roller 166, and the tension roller in the direction indicated by an arrow shown in FIG. 50. The primary transfer roller 166 transfers a developed image onto the intermediate transfer belt 169, which passes between the photoconductor drum and the primary transfer roller 166, by electrostatically attracting the developed image from the photoconductor drum 165.

Specifically, at first rotation of the photoconductor drum 165, an electrostatic latent image for a yellow (Y) image is written by the exposure device 167, a developed image corresponding to the same color is formed by the developing section 163Y, and then the developed image is transferred onto the intermediate transfer belt 169. Then, at next rotation of the photoconductor drum 165, an electrostatic latent image for a cyan (C) image is written by the exposure device 167, a developed image corresponding to the same color is formed by the developing section 163C, and then the developed image is transferred onto the intermediate transfer belt 169 so as to overlap the yellow developed image. Then, while the photoconductor drum 165 rotates four times in such a manner, developed images corresponding to yellow, cyan, magenta, and black sequentially overlap each other on the intermediate transfer belt 169. As a result, a full-color developed image is formed on the intermediate transfer belt 169. In the case of forming images on both surfaces of a sheet, on which the images are to be formed finally, full-color developed images are obtained on the intermediate transfer belt 169 in a method in which developed images having the same color on top and bottom surfaces of the sheet are transferred onto the intermediate transfer belt 169 and then developed images having the same next color on the top and bottom surfaces are transferred onto the intermediate transfer belt 169.

In the image forming apparatus, a transport path 174 along which a sheet passes is provided. A sheet is fed from a paper feed cassette 178 one by one by a pickup roller 179. Then, the sheet progresses along the transport path 174 by means of a transport roller and passes through a nip between the intermediate transfer belt 169 being in contact with the driving roller 170a and a secondary transfer roller 171. The secondary transfer roller 171 transfers a developed image on a single surface of the sheet by electrostaticlly and collectively attracting a full-color image from the intermediate transfer belt 169. The secondary transfer roller 171 is provided to be brought into contact with or spaced apart from the intermediate transfer belt 169 by a clutch (not shown). Moreover, the secondary transfer roller 171 comes into contact with the intermediate transfer belt 169 at the time of transferring a full-color developed image on a sheet, and the secondary transfer roller 171 is spaced apart from the intermediate transfer belt 169 while a developed image is put on the intermediate transfer belt 169.

The sheet, on which the image has been transferred as mentioned above, is transported to a fixing unit 172 and then passes between a heating roller 172a and a pressing roller 172b of the fixing unit 172, such that the developed image is fixed on the sheet. The sheet after the fixing process is pulled in between a pair of paper ejection rollers 176 and progresses in the direction indicated by an arrow F shown in FIG. 50. In the case of double-sided printing, the pair of paper ejection rollers 176 rotate in the opposite direction after most of the sheet has passed through the pair of paper ejection rollers 176, such that the sheet is introduced along a double-sided printing transport path 175 as indicated by an arrow G shown in FIG. 50. Then, a developed image is transferred onto the other surface of the sheet by means of the secondary transfer roller 171 and is then fixed again by the fixing unit 172. Then, the sheet is ejected by the pair of paper ejection rollers 176.

Having described about examples of an image forming apparatus, the light-emitting device 10 or the light-emitting device 50 may be applied to other electrophotographic image forming apparatuses. For example, the light-emitting device 10 or the light-emitting device 50 may be applied to an image forming apparatus that directly transfers a developed image onto a sheet without using an intermediate transfer belt, an image forming apparatus that forms a monochromic image, or an image forming apparatus using a photoconductor belt as an image carrier. The same applications as described above may also be applied to the various kinds of light-emitting devices according to the modified examples of the light-emitting device 10 or the light-emitting device 50.

Display Device

Figure 51:
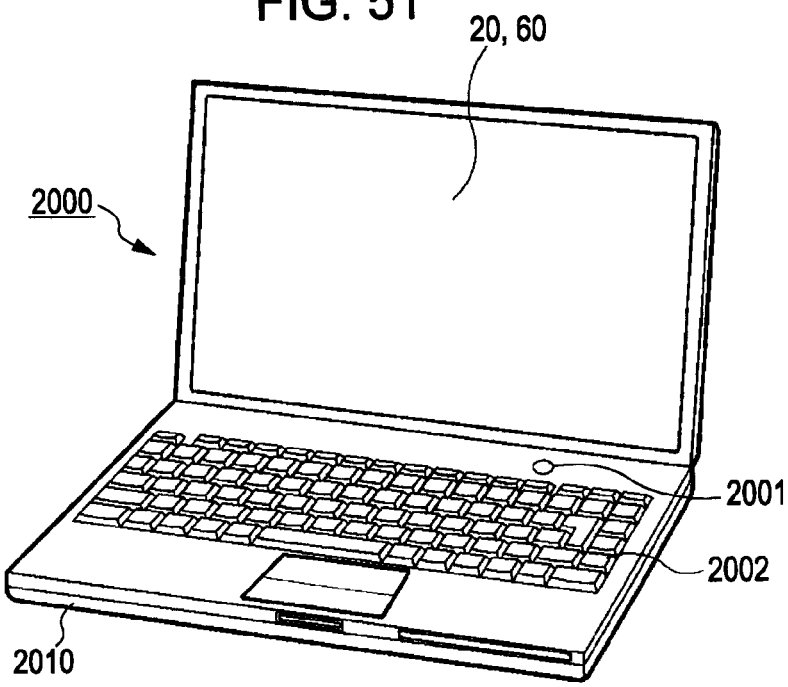
FIG. 51 is a view illustrating the configuration of a portable personal computer to which the light-emitting device according to the second embodiment or the light-emitting device according to the fourth embodiment is applied as a display device.

FIG. 51 is a view illustrating the configuration of a portable personal computer to which the light-emitting device 20 or the light-emitting device 60 is applied as a display device. A personal computer 2000 includes the light-emitting device 20 or the light-emitting device 60, which serves as a display device, and a main body 2010. The main body 2010 includes a power switch 2001 and a keyboard 2002.

Figure 52:
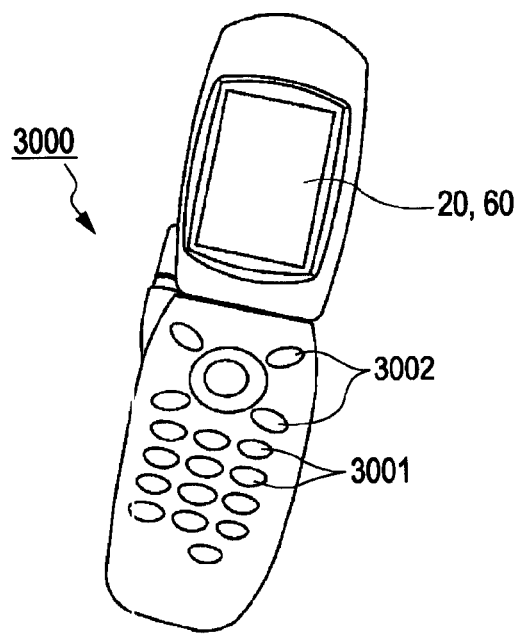
FIG. 52 is a view illustrating the configuration of a mobile phone to which the light-emitting device according to the second embodiment or the light-emitting device according to the fourth embodiment is applied as a display device.

FIG. 52 is a view illustrating the configuration of a mobile phone to which the light-emitting device 20 or the light-emitting device 60 is applied as a display device. A mobile phone 3000 includes a plurality of operation buttons 3001, a plurality of scroll buttons 3002, and the light-emitting device 20 or the light-emitting device 60 serving as a display device. By operating the scroll buttons 3002, a screen displayed on the light-emitting device 20 or the light-emitting device 60 is scrolled.

Figure 53:
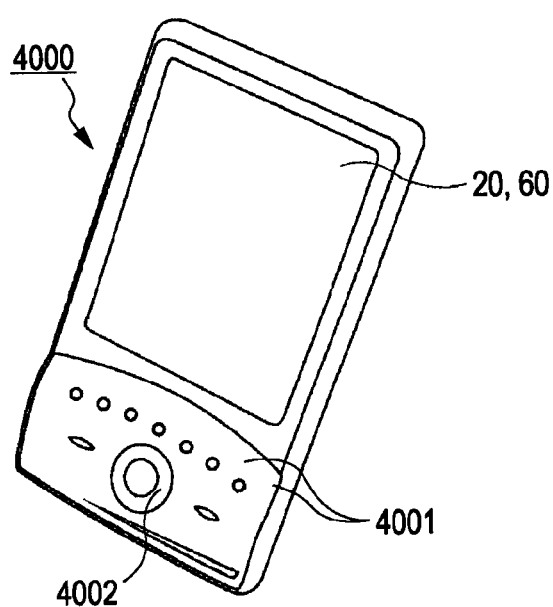
FIG. 53 is a view illustrating the configuration of a personal digital assistant to which the light-emitting device according to the second embodiment or the light-emitting device according to the fourth embodiment is applied as a display device.

FIG. 53 is a view illustrating the configuration of a personal digital assistant (PDA) to which the light-emitting device 20 or the light-emitting device 60 is applied as a display device. A personal digital assistant 4000 includes a plurality of operation buttons 4001, a power switch 4002, and the light-emitting device 20 or the light-emitting device 60 serving as a display device. By operating the power switch 4002, various kinds of information, such as an address list or a schedule, are displayed on the light-emitting device 20 or the light-emitting device 60.

In addition, a display device to which the light-emitting device 20 or the light-emitting device 60 is applied or an electronic apparatus having the display device includes a digital still camera, a television, a video camera, a car navigator, a pager, an electronic diary, an electronic paper, a calculator, a word processor, a workstation, a video phone, a POS terminal, a printer, a scanner, a copying machine, a video player, an apparatus having a touch panel, and the like, as well as those shown in FIGS. 51 to 53. The same applications as described above may also be applied to the various kinds of light-emitting devices according to the modified examples of the light-emitting devices 20 and 60, the light-emitting devices 10 and 50, or the various kinds of light-emitting devices according to the modified examples of the light-emitting devices 10 and 50. In addition, by using a color filter or a color conversion layer, it may be possible to display a full-color image in a display device in which the light-emitting devices 10 and 50 or the various kinds of light-emitting devices according to the modified examples of the light-emitting devices 10 and 50 are applied.

The entire disclosure of Japan Patent Application Nos: 2006-168402, filed Jun. 19, 2006 and 2006-168403, filed Jun. 19, 2006 are expressly incorporated by reference herein.

What is claimed is:

1. A light-emitting device comprising:
   a substrate;
   a light reflective layer that is formed on the substrate and reflects light;
   a transparent layer that is formed on the light reflective layer and transmits light;
   a first electrode that is formed on the transparent layer and transmits light;
   a light-emitting layer that is formed on the first electrode and emits light;
   a second electrode that is formed on the light-emitting layer, and transmits a part of light from the light-emitting layer and reflects another part of the light; and
   a conductive transflective layer that is formed on the second electrode, and transmits a part of light from the second electrode and reflects another part of the light,
   wherein the conductive transflective layer is formed of platinum.

2. The light-emitting device according to claim 1,
   wherein silver, magnesium, aluminum, or an alloy including aluminum is included in a material that forms the light reflective layer.

3. The light-emitting device according to claim 1,
   wherein a material that forms the transparent layer is silicon dioxide or silicon nitride.

4. The light-emitting device according to claim 1,
   wherein a thickness of the first electrode is less than 60 nm, and
   wherein a thickness of one or both of the transparent layer and the light-emitting layer is set such that (i) a distance between the light reflective layer and the second electrode and (ii) a light-emitting dominant wavelength of the light-emitting layer satisfy a predetermined relationship.

5. The light-emitting device according to claim 1,
   wherein a thickness of the first electrode is less than 60 nm, and
   wherein a thickness of at least one of the transparent layer, the light-emitting layer, and the conductive transflective layer is set such that (i) a distance between the reflective layer and the conductive transflective layer and (ii) a light-emitting dominant wavelength of the light-emitting layer satisfy a predetermined relationship.

6. An electronic apparatus comprising the light-emitting device according to claim 1.

* * * * *